(12) United States Patent
Sforzin et al.

(10) Patent No.: US 11,574,669 B2
(45) Date of Patent: Feb. 7, 2023

(54) DISTRIBUTION-FOLLOWING ACCESS OPERATIONS FOR A MEMORY DEVICE

(71) Applicant: Micron Technology, Inc., Boise, ID (US)

(72) Inventors: Marco Sforzin, Cernusco sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/502,451

(22) Filed: Oct. 15, 2021

(65) Prior Publication Data

US 2022/0036937 A1 Feb. 3, 2022

Related U.S. Application Data

(62) Division of application No. 16/544,730, filed on Aug. 19, 2019, now Pat. No. 11,164,619.

(51) Int. Cl.
*G11C 11/4074* (2006.01)
*G06F 12/14* (2006.01)
*G11C 11/409* (2006.01)

(52) U.S. Cl.
CPC .......... *G11C 11/4074* (2013.01); *G06F 12/14* (2013.01); *G11C 11/409* (2013.01)

(58) Field of Classification Search
CPC ................................................. G11C 11/4074
USPC ..................................................... 365/189.09
See application file for complete search history.

(56) References Cited

U.S. PATENT DOCUMENTS

| | | | |
|---|---|---|---|
| 9,990,990 B2 | 6/2018 | Fantini et al. | |
| 10,541,031 B2* | 1/2020 | Dunga | G11C 16/24 |
| 2007/0041235 A1* | 2/2007 | Inoue | G11C 7/18 |
| | | | 365/148 |
| 2009/0316487 A1 | 12/2009 | Lee et al. | |

(Continued)

FOREIGN PATENT DOCUMENTS

KR 20190018548 A 2/2019

OTHER PUBLICATIONS

ISA/KR, International Search Report and Written Opinion of the International Searching Authority, Int'l Appl. No. PCT/US2020/044255, dated Nov. 11, 2020, Korean Intellectual Property Office, Seo-gu, Daejeon, Republic of Korea, 12pgs.

(Continued)

*Primary Examiner* — Muna A Techane
(74) *Attorney, Agent, or Firm* — Holland & Hart LLP

(57) ABSTRACT

Methods, systems, and devices for distribution-following access operations for a memory device are described. In an example, the described techniques may include identifying an activation of a first memory cell at a first condition of a biasing operation, and identifying an activation of a second memory cell at a second condition of the biasing operation, and determining a parameter of an access operation based at least in part on a difference between the first condition and the second condition. In some examples, the memory cells may be associated with a configurable material element, such as a chalcogenide material, that stores a logic state based on a material property of the material element. In some examples, the described techniques may at least partially compensate for a change in memory material properties due to aging or other degradation or changes over time.

20 Claims, 10 Drawing Sheets

(56) References Cited

U.S. PATENT DOCUMENTS

| | | | |
|---|---|---|---|
| 2012/0170359 A1* | 7/2012 | Wu | H01L 45/06 365/163 |
| 2013/0227200 A1* | 8/2013 | Cometti | G06F 3/0629 711/103 |
| 2014/0056068 A1 | 2/2014 | Strasser et al. | |
| 2015/0325289 A1 | 11/2015 | Castro | |

OTHER PUBLICATIONS

Taiwan Intellectual Property Office, "Office Action," issued in connection with ROC (Taiwan) Patent Application No. 109123814, dated Apr. 14, 2021 (4 pages).

* cited by examiner

DISTRIBUTION-FOLLOWING ACCESS OPERATIONS FOR A MEMORY DEVICE

CROSS REFERENCE

The present application for patent is a divisional of U.S. patent application Ser. No. 16/544,730 by Sforzin et al., entitled "DISTRIBUTION-FOLLOWING ACCESS OPERATIONS FOR A MEMORY DEVICE," filed Aug. 19, 2019, assigned to the assignee hereof, and is expressly incorporated by reference in its entirety herein.

BACKGROUND

The following relates generally to memory devices and more specifically to distribution-following access operations for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory (SSM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices may include increasing memory cell density, increasing read/write speeds, increasing reliability, increasing data retention, reducing power consumption, or reducing manufacturing costs, among other metrics. In some applications, material characteristics or responsive behaviors of memory cells may change over time, which may affect performance of a memory device.

DETAILED DESCRIPTION

Figure 1:
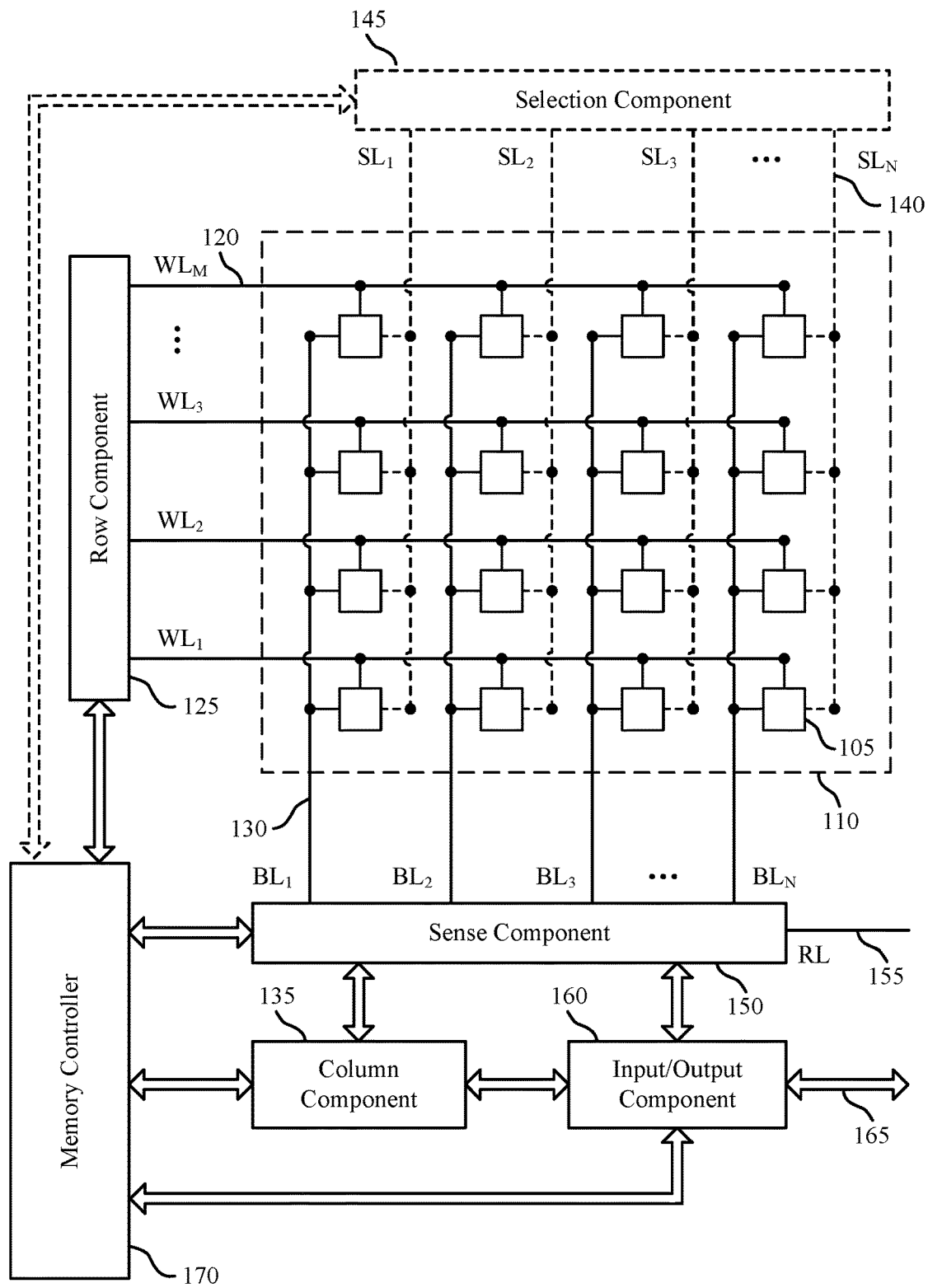
FIG. 1 illustrates an example of a memory device that supports distribution-following access operations in accordance with examples as disclosed herein.

In some memory devices, a memory cell architecture may store a logic state in a configurable material (e.g., in a physical characteristic or property of the material), such as a chalcogenide. For example, different material characteristics or properties of a material may be configurable based on aspects of a write operation, and differences in the material characteristics or properties may be detected during a read operation to distinguish whether a memory cell was written with one logic state or another (e.g., a logic 0 or a logic 1). In some examples, a logic state stored by a configurable material may be based at least in part on a polarity of a voltage across the configurable material during a write operation. In some examples, a logic state stored by a configurable material may be based at least in part on a direction of current applied through a configurable material during a write operation, or a combination of a polarity of a voltage across the configurable material and a direction of current applied through a configurable material during a write operation.

In some examples, the polarity used for programming may be accompanied by a particular behavior or characteristic of a configurable material, such as a threshold voltage of the material, which may be used to detect a logic state stored by the memory cell (e.g., in a read operation). For example, one polarity of a write operation may be associated with a relatively high threshold voltage of the configurable material (e.g., for a particular read operation, for a particular read voltage), whereas another polarity of a write operation may be associated with a relatively low threshold voltage of the configurable material (e.g., for the particular read operation, for the particular read voltage). In such examples, a presence or absence of current through the material in response to a read voltage applied across the material may be used to determine (e.g., distinguish) whether the memory cell was written with one polarity or another, thereby providing an indication of the logic state that was written to the memory cell.

In some memory applications, material characteristics, material properties, or responsive behaviors of a configurable material may change or migrate over time (e.g., due to aging, wear, degradation, compositional changes or migrations, changes in operating conditions such as temperature, or other changes). For example, as a configurable material accumulates access operations (e.g., write operations, read operations, cycles), the response of the configurable material to a given write operation may change. In one example, as a configurable material accumulates access operations, a programmed threshold voltage may migrate (e.g., increase or decrease) in response to a given write operation (e.g., a write operation according to a particular pulse amplitude and particular pulse duration). Additionally or alternatively, when a temperature of a configurable material changes, a programmed threshold voltage in response to a given write operation may migrate. Moreover, threshold voltages may migrate differently for each memory cell of a set of memory cells, which may be accompanied by various changes to an average threshold voltage of the set of memory cells (e.g., corresponding to a particular logic state), various changes to a standard deviation or other distribution of threshold voltages of the set of memory cells (e.g., corresponding to the particular logic state), or various other characteristics or combinations of characteristics of threshold voltage distributions (e.g., statistical distributions). Such migrations of threshold voltages may reduce read margins in architectures that rely on a fixed read voltage to distinguish one logic state from another (e.g., as the threshold voltage for a logic state migrates towards the fixed read voltage).

In accordance with aspects of the present disclosure, an access operation such as a read operation may be adjusted over the course of operating a memory device to compensate for aging, wear, degradation, temperature changes, or other changes or migrations in a configurable material used to store logic states. For example, to compensate for a change in threshold voltage distribution in a set of memory cells, a memory device may detect aspects of such a distribution, and determine a parameter of an access operation (e.g., a read operation) based at least in part on such a detection. The detection may be based on a biasing operation, such as a ramped or stepped application of voltage to a set of memory cells, which may or may not be part of the access operation itself.

In some examples, distribution detection may be based on or otherwise include detecting activations of particular memory cells during a biasing operation, detecting particular counts or indexes of activation events (e.g., thresholding events, switching events), or detecting that particular quantities of memory cells have been activated, and a parameter determined for an access operation may be based on conditions of the biasing operation associated with the detecting. Parameters determined for an access operation may include a voltage (e.g., a voltage magnitude, a voltage offset, a reference voltage, a peak voltage, a final voltage), a time (e.g., a duration, a time offset, a reference time, a final time), or other aspects of a biasing operation or access operation. Accordingly, various examples of the described techniques may be used to compensate for various changes in material characteristics or responsive behaviors of a configurable material used to store information in a memory device, which may improve the performance of a memory device.

Features of the disclosure are initially described in the context of memory systems and circuitry with reference to FIG. 1. Features of the disclosure are further described in the context of voltage threshold distributions and distribution-following access operations with reference to FIGS. 2-6. These and other features of the disclosure are further illustrated by and described with reference to an apparatus diagram and flowcharts that relate to distribution-following access operations for a memory device as described with references to FIGS. 7-10.

FIG. 1 illustrates an example of a memory device 100 that supports distribution-following access operations in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, which may be denoted as a logic 0 and a logic 1. In some cases, a memory cell 105 may be programmable to store more than two logic states. In the example of memory device 100, different logic states may be programmed by writing memory cells 105 having configurable material characteristics or material properties that correspond to different logic states, where such material characteristics or material properties (e.g., material states) may be detected during a subsequent read operation to identify a stored logic state.

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip), or a set or bank of more than one contiguous tile of memory cells 105. In some examples, a memory section 110 or a memory tile may refer to the smallest set of memory cells 105 that may be biased in an access operation, or a smallest set of memory cells 105 that share a common node (e.g., a common source node, a common source plate, a set of source lines that are biased to a common voltage). Although a single memory section 110 of the memory device 100 is shown, various examples of a memory device in accordance with the present disclosure may have multiple memory sections 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In the example of memory device 100, a memory cell 105 may include or otherwise be associated with a configurable material, which may be referred to as a memory element, a memory storage element, a material element, a material memory element, a material portion, a polarity-written material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material.

In some examples, a characteristic or property of such a material may be configurable based at least in part on a polarity of a voltage (e.g., an orientation of an electric field) across the material during a write operation. For example, the configurable material may be associated with different electrical resistances or threshold characteristics depending on a polarity of a voltage during the write operation. In one example, a state of the configurable material after a write operation with a negative voltage polarity may have a relatively low electrical resistance or threshold voltage (e.g., corresponding to a "SET" material state, which may correspond to a logic 0), whereas a state of the material after a write operation with a positive voltage polarity may have a relatively high electrical resistance or threshold voltage (e.g., corresponding to a "RESET" material state, which may correspond to a logic 1). In some cases, a relatively high or low resistance or threshold voltage of a written memory cell 105 may be associated with or be otherwise based at least in part on a polarity of a voltage applied during a read operation. For example, a configurable material of a memory cell 105 having a relatively high or low resistance or threshold voltage may be dependent on whether a read operation performed on the memory cell 105 has a same polarity, or a different polarity (e.g., an opposite polarity), as a preceding write operation.

In some cases, a configurable material of a memory cell 105 may be associated with a threshold voltage, which may depend on the polarity of a write operation. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with a positive polarity or a negative polarity. Accordingly, the magnitude of current, or other characteristic (e.g., thresholding behavior, resistance breakdown behavior, snapback behavior) associated with the current, that results from applying a read voltage to the memory cell 105 may be used to determine a logic state stored by memory cell 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a bit line (BL), such as one of $BL_1$ through $BL_N$). The plurality of first access lines 120 may be coupled with a row component 125, which may control various operations such as activating or biasing one or more of the plurality of first access lines 120, or selectively coupling one or more of the plurality of first access lines 120 with a voltage source, current source, or other circuit element. The plurality of second access lines 130 may be coupled with a sense component 150, which may support the detection of logic states stored by memory cells 105. In some examples, a sense component 150 may be in communication with a column component 135, or may include or be otherwise co-located with a column component 135, where a column component 135 may control various operations such as activating or biasing one or more of the plurality of second access lines 130, or selectively coupling one or more of the plurality of second access lines 130 with a voltage source, current source, or other circuit element. In some cases, first access lines 120 and second access lines 130 may be substantially perpendicular to one another in the memory device 100 (e.g., when viewing a plane of a deck, layer, or level of the memory device 100, as shown in FIG. 1). References to word lines and bit lines, or their analogues, are interchangeable without loss of understanding or operation.

In general, one memory cell 105 may be located at the intersection of (e.g., coupled with, coupled between) a first access line 120 and a second access line 130. This intersection, or an indication of this intersection, may be referred to as an address of a memory cell 105. A target or selected memory cell 105 may be a memory cell 105 located at the intersection of a biased or otherwise selected first access line 120 and a biased or otherwise selected second access line 130. In other words, a first access line 120 and a second access line 130 may be biased or otherwise selected to access (e.g., read, write, rewrite, refresh) a memory cell 105 at their intersection. Other memory cells 105 that are not at the intersection of a target memory cell 105 may be referred to as non-target or non-selected memory cells 105.

In some examples, the memory cells 105 of the memory section 110 may also be coupled with one of a plurality of third access lines 140 (e.g., a selection line (SL), such as one of $SL_1$ through $SL_N$). The plurality of third access lines 140 may be coupled with a selection component 145, which may control various operations such as activating or biasing one or more of the plurality of third access lines 140, or selectively coupling one or more of the plurality of third access lines 140 with a voltage source, current source, or other circuit element. In some examples, a third access line 140 may be coupled with a cell selection component (e.g., a transistor, a switching component) associated with respective memory cells 105, where such a cell selection component may be configured to selectively couple the memory cell 105 with an associated first access line 120, or associated second access line 130, or selectively permit or suppress current flow through the respective memory cell 105 (e.g., between a first access line 120 and a second access line 130).

Although the plurality of third access lines 140 of the memory device 100 are shown as being parallel with the plurality of second access lines 130, in other examples, a plurality of third access lines 140 may be parallel with the plurality of first access lines 120, or in any other configuration. For example, in the example of memory device 100, each of the third access lines 140 may correspond to a respective one of the second access lines 130. In another example, each of the third access lines 140 may correspond to a respective one of the first access lines 120. In another example, cell selection operations (e.g., biasing a cell selection line, activating cell selection components of one or more memory cells 105), where implemented, may be performed or otherwise supported by the row component 125 (e.g., for selecting or activating cell selection components of a row or page of memory cells 105), and the selection component 145 may be replaced by, or otherwise perform operations related to a source driver for biasing third access lines 140, which may correspond to individually-controllable source lines, a common source plate, or a common source node.

In other examples, the third access lines 140 and the selection component 145 may be omitted from a memory device 100, and accessing memory cells 105 may rely on self-selecting properties of the memory cells 105. For example, the row component 125 and the column component 135 may support fully-decoded operations, where each of the first access lines 120 and each of the second access lines 130 may be individually biased (e.g., in a cross-point configuration). In such examples, accessing memory cells 105 may rely on a self-selecting characteristic of a target memory cell 105 that may be activated based on a voltage, between an activated first access line 120 and activated second access line 130 associated with the target memory cell 105, exceeding a threshold voltage. In various examples, such a self-selecting characteristic may be supported by the logic-storing configurable material element of a memory cell 105, or may be supported by a material portion of a memory cell 105 that is different from a logic-storing portion (e.g., an ovonic threshold switching portion separate from a logic-storing portion).

In some examples, a first access line 120 may provide access to one area (e.g., one side, one end) of the configurable material portion of a memory cell 105, and a second access line 130 may provide access to another area (e.g., a different side, an opposite side, an opposite end) of the configurable material portion of the memory cell 105. For example, first access lines 120 may be located above the memory cells 105 (e.g., relative to a substrate) and second access lines 130 may be located below the memory cells 105 (e.g., relative to the substrate), or vice versa. Thus, a first access line 120 and a second access line 130 may support applying voltage or current across a configurable material portion of a memory cell 105 with different polarities (e.g., a first polarity when a voltage of a first access line 120 is higher than a voltage of a second access line 130, a second polarity when a voltage of a first access line 120 is lower than a voltage of a second access line 130). Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein.

Access operations such as reading, writing, rewriting, and refreshing may be performed on a memory cell 105 by activating or selecting a first access line 120, a second access line 130, or a third access line 140 (e.g., where present) that are coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, silicon (e.g., polycrystalline or amorphous) or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a configurable material portion storing a logic state may be read by applying a read voltage or bias across the memory cell 105, and the resulting flow of current via an access line (e.g., via a second access line 130), or lack thereof, or other characteristic of current flow may be detected, converted, or amplified to determine the programmed logic state stored by the memory cell 105.

Accessing memory cells 105 may be controlled through a row component 125 (e.g., a row decoder), a column component 135 (e.g., a column decoder), or a selection component 145 (e.g., a cell selection driver or a source driver, when included in a memory device 100), or a combination thereof. For example, a row component 125 may receive a row address from the memory controller 170 and select, activate, or bias the appropriate first access line 120 based on the received row address. Similarly, a column component 135 may receive a column address from the memory controller 170 and select, activate, or bias the appropriate second access line 130. Thus, in some examples, a memory cell 105 may be accessed by selecting or activating a first access line 120 and a second access line 130. In various examples, any one or more of the row component 125, the column component 135, or the selection component 145 may be referred to as, or otherwise include access line drivers, access line decoders, access line multiplexers, or other circuitry.

In some examples, the memory controller 170 may control the operation (e.g., read operations, write operations, rewrite operations, refresh operations) of memory cells 105 through the various components (e.g., a row component 125, a column component 135, selection component 145, a sense component 150). In some cases, one or more of a row component 125, a column component 135, a selection component 145, or a sense component 150 may be co-located or otherwise considered to be included with the memory controller 170. In some examples, one or more of a row component 125, a column component 135, or the sense component 150 may be otherwise co-located (e.g., in common circuitry, in a common portion of the memory device 100). In some examples, any one or more of a row component 125, a column component 135, or a selection component 145 may be referred to as a memory controller or circuitry for performing access operations of the memory device 100. In some examples, any one or more of a row component 125, a column component 135, or a selection component 145 may be described as controlling or performing operations for accessing a memory device 100, or controlling or performing operations for accessing the memory section 110 of the memory device 100.

The memory controller 170 may generate row and column address signals to activate a target first access line 120 and a target second access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single row component 125, a single column component 135, and a single selection component 145, other examples of a memory device 100 may include different configurations to accommodate a memory section 110 or a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110.

A configurable material of a memory cell 105 may be set, written, or refreshed by biasing various combinations of the associated first access line 120, second access line 130, or third access line 140 (e.g., via a memory controller 170). In other words, a logic state may be stored in the configurable material of a memory cell 105 (e.g., via a cell access signal, via a cell write signal). A row component 125, a column component 135, or a selection component 145 may accept data, for example, via input/output component 160, to be written to the memory cells 105. In some examples, a write operation may be performed at least in part by a sense component 150, or a write operation may be configured to bypass a sense component 150 (e.g., being performed by a column component 135). The configurable material of a memory cell 105 may be written with a logic state that is based at least in part on a polarity of a write voltage across the memory cell 105, which, in some examples, may be accompanied by a write current (e.g., based at least in part on the write voltage, driven by a current source).

A configurable material of a memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the column component 135, the input/output component 160, the memory controller 170). In some examples, the detected logic state may be provided to a host device (e.g., a device that uses the memory device 100 for data storage, a processor coupled with the memory device 100 in an embedded application), where such signaling may be provided directly from the input/output component (e.g., via I/O line 165) or via the memory controller 170. In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

During or after accessing a memory cell 105, the configurable material portion of a memory cell 105 may or may not permit electrical charge or current to flow via its corresponding access lines 120 or 130 (e.g., in response to a read voltage). Such charge or current may result from biasing, or applying a voltage, to the memory cell 105 from one or more voltage sources or supplies (not shown) of the memory device 100, where voltage sources or supplies may be part of a row component 125, a column component 135, a sense component 150, a memory controller 170, or some other component (e.g., a biasing component). In some examples (e.g., in a memory architecture that includes cell selection components), the described biasing may be supported by an activation of a cell selection component of a target memory cell 105, a deactivation of a cell selection component of a non-target memory cell 105, or both.

In some examples, when a read bias (e.g., a read pulse, a read current, a read voltage) is applied across a memory cell 105 with a configurable material storing a first logic state (e.g., a "SET" material state, associated with a first write polarity), the memory cell 105 may conduct current due to the read bias exceeding a threshold voltage of the memory cell 105. In response to, or based at least in part on this, the sense component 150 may therefore detect a current through the memory cell 105 (e.g., via a second access line 130) as part of determining the logic state stored by the memory cell 105. When a read bias is applied to the memory cell 105 with the configurable material storing a second logic state (e.g., a "RESET" material state, associated with a second write polarity different than the first write polarity), the memory cell 105 may not conduct current due to the read bias not exceeding the threshold voltage of the memory cell 105. The sense component 150 may therefore detect little or no current through the memory cell 105 as part of determining the stored logic state.

In some examples, a reference current may be defined for sensing the logic state stored by a memory cell 105. The reference current may be set above a current that passes through the memory cell 105 when the memory cell 105 does not threshold in response to the read bias, but equal to or below an expected current through the memory cell 105 when the memory cell 105 does threshold in response to the read bias. For example, the reference current may be higher than a leakage current of the associated access lines 120 or 130 (e.g., higher than a leakage current associated with one or more memory cells 105 coupled with an access line 120 or 130 that is common with a target memory cell 105). In some examples, a logic state stored by a memory cell 105 may be determined based at least in part on a voltage (e.g., across a shunt resistance) resulting from the current driven by a read pulse. For example, the resulting voltage may be compared relative to a reference voltage (e.g., as generated within the sense component 150 or provided via a reference line (RL) 155), with a resulting voltage less than the reference voltage corresponding to a first logic state and a resulting voltage greater than the reference voltage corresponding to a second logic state.

In some examples, more than one voltage or current may be applied when reading a memory cell 105 or set of memory cells 105 (e.g., multiple voltages may be applied during portions of a read operation). For example, if an applied read voltage does not result in current flow, or a threshold quantity of memory cells 105 being activated, one or more other read voltages or voltage polarities may be applied (e.g., until a current is detected by sense component 150, based at least in part on a threshold quantity of memory cells 105 being activated). Based at least in part on assessing the read voltage that resulted in current flow, the stored logic state of the memory cell 105 may be determined. In some cases, a read voltage or current may be ramped (e.g., smoothly increasing higher in magnitude) or stepped (e.g., increasing by discrete amounts according to discrete intervals) until a current flow or other condition is detected by a sense component 150 or memory controller 170. In other cases, predetermined read voltages may be applied (e.g., a predetermined sequence of read voltages that increase higher in magnitude in a stepwise manner, a predetermined sequence of read voltages that include different read voltage polarities) until a current is detected, or otherwise based on a quantity of memory cell activations. Likewise, a read current may be applied to a memory cell 105 and the magnitude or polarity of the voltage to create the read current may depend on the electrical resistance or the total threshold voltage of the memory cell 105.

A sense component 150 may include various switching components, selection components, multiplexers, transistors, amplifiers, capacitors, resistors, voltage sources, current sources, or other components to detect, convert, or amplify a difference in sensing signals (e.g., a difference between a read voltage and a reference voltage, a difference between a read current and a reference current), which, in some examples, may be referred to as latching or generating a latch signal. In some examples, a sense component 150 may include a collection of components (e.g., circuit elements, circuitry) that are repeated for each of a set of second access lines 130 connected to the sense component 150. For example, a sense component 150 may include a separate sensing circuit or circuitry (e.g., a separate sense amplifier, a separate signal development component) for each of a set of second access lines 130 coupled with the sense component 150, such that a logic state may be separately detected for a respective memory cell 105 coupled with a respective one of the set of second access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120 or 130 of a memory section 110).

In some memory architectures, accessing a memory cell 105 may degrade or destroy a logic state stored by one or more memory cells 105 of the memory section 110, and rewrite or refresh operations may be performed to return the original logic state to the memory cells 105. In architectures that include a configurable material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a configurable material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain or rewrite stored logic states. Refreshing a memory cell 105 may reduce or eliminate read disturb errors or logic state corruption due to a change in the material state of a configurable logic storage material over time.

In some cases, material characteristics, material properties, or responsive behaviors of a configurable material associated with the memory cells 105 may change or migrate over time (e.g., due to aging, wear, degradation, compositional changes or migrations, operating temperatures, or other changes). For example, as a configurable material of a memory cell 105 accumulates access operations (e.g., write operations, read operations), the response of the memory cell 105 to a given write operation or read operation may change. In one example, as a configurable material accumulates access operations, a programmed threshold voltage of the memory cell 105 may migrate in response to a given write operation (e.g., a write operation according to a pulse amplitude and pulse duration, a write operation corresponding to a particular logic state). Additionally or alternatively, when a temperature of a configurable material changes (e.g., related to an ambient environmental temperature around the memory device 100 or an internal operating temperature of the memory device 100), a programmed threshold voltage of one or more memory cells 105 (e.g., corresponding to a particular logic state) in response to a given write operation or read operation may migrate. Threshold voltages may migrate differently for each memory cell 105 of a set of memory cells 105 (e.g., a column of memory cells 105, a row of memory cells 105, memory cells 105 of a memory section 110), which may be accompanied by various changes to an average threshold voltage of the set of memory cells 105 (e.g., corresponding to a particular logic state), various changes to a standard deviation of threshold voltages of the set of memory cells (e.g., corresponding to the particular logic state), or various other characteristics or combinations of characteristics of threshold voltage distributions (e.g., statistical distributions).

In accordance with examples of the present disclosure, various aspects of a read operation may be adjusted over the course of operating the memory device 100 (e.g., accessing the memory cells 105) to compensate for aging, wear, degradation, temperature changes, or other changes in a configurable material used to store logic states in the memory cells 105 (e.g., changes to a distribution of material characteristics corresponding to a logic state). For example, to compensate for a change in threshold voltage distribution for a particular logic state in a set of memory cells 105 (e.g., a column of memory cells 105, a row of memory cells 105, memory cells 105 of a memory section 110), the memory device 100 (e.g., the sense component 150, the memory controller 170) may detect aspects of such a distribution, and determine a parameter of an access operation (e.g., a read operation) based at least in part on such a detection. The detection may be based on a biasing operation, such as a ramped or stepped application of voltage to a set of memory cells 105, which may or may not be part of the access operation itself (e.g., may or may not be part of a read operation), and a time, voltage, or other aspect of an access operation may be determined based on the detection.

Accordingly, various examples of the described techniques may be used to compensate for various changes or migrations of material characteristics or responsive behaviors of a configurable material used to store information in the memory device 100, which may improve the performance of a memory device 100 compared to other memory devices that do not compensate for such changes.

Figure 2:
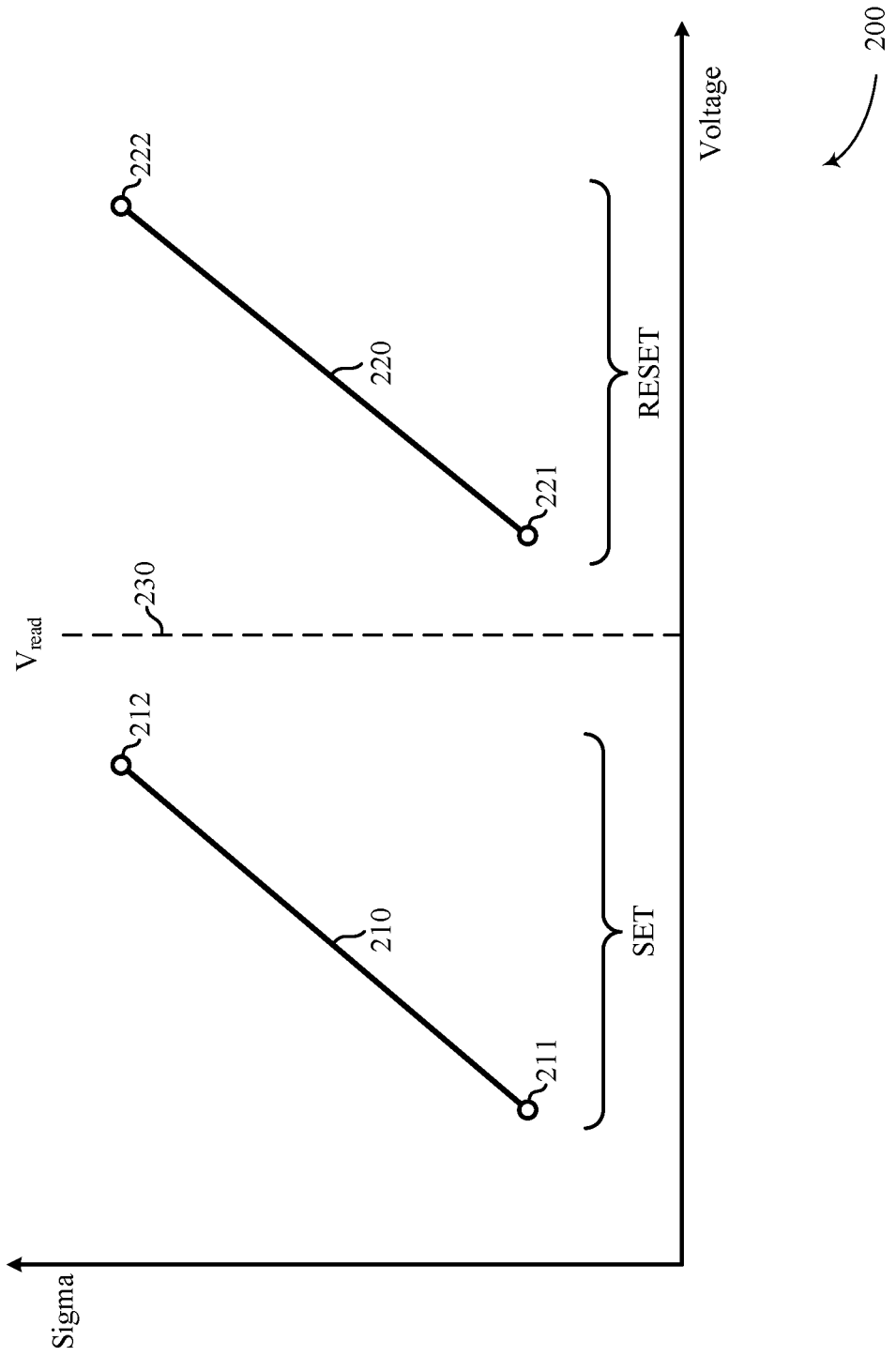
FIG. 2 illustrates a plot of threshold voltage distributions in a memory device that supports distribution-following access operations in accordance with examples as disclosed herein.

FIG. 2 illustrates a plot 200 of threshold voltage distributions in a memory device 100 that supports distribution-following access operations in accordance with examples as disclosed herein. The plot 200 may illustrate threshold voltage distributions of a representative population of memory cells 105 (e.g., a representative population of configurable material memory elements) of a memory device 100 with respect to a standard deviation, sigma, or some other probabilistic measure. For illustration purposes, the sigma axis may be a nonlinear axis so that a normal distribution of threshold voltages may be illustrated as linear distributions in the plot 200. In some examples, the distributions of the plot 200 may be referred to as Gaussian distributions.

The distribution 210 may illustrate a distribution of threshold voltages for the representative population of memory cells 105 when storing a first logic state or material state (e.g., a "SET" state). The distribution 210 may be associated with a lower boundary or edge (e.g., edge 211), which may be referred to as "E1," and an upper boundary or edge (e.g., edge 212), which may be referred to as "E2." The distribution 210 may illustrate various interpretations of a statistical distribution, such as a span of six standard deviations (e.g., six sigma), a span of twelve standard deviations (e.g., twelve sigma), or a span between a minimum and maximum threshold voltage of the representative population of memory cells 105 when storing the SET state.

The distribution 220 may illustrate a distribution of threshold voltages for the representative population of memory cells 105 when storing a second logic state or material state (e.g., a "RESET" state). The distributions 220 may be associated with a lower boundary or edge (e.g., edge 221), which may be referred to as "E3," and an upper boundary or edge (e.g., edge 222), which may be referred to as "E4." The distributions 220 may illustrate various interpretations of a statistical distribution, such as a span of six standard deviations (e.g., six sigma), a span of twelve standard deviations (e.g., twelve sigma), or a span between a minimum and maximum threshold voltage of the representative population of memory cells 105 when storing the RESET state.

The plot 200 also illustrates a read voltage 230 (e.g., a reference voltage) that may be used for detecting or distinguishing respective logic states stored by the representative population of memory cells 105. For example, referring to the distributions 210 and 220, memory cells 105 of the representative population that store the SET state may permit a flow of current (e.g., a flow of current above a threshold amount of current) when applying the read voltage 230, because the read voltage 230 is above the threshold voltage for each of those memory cells 105 (e.g., because the distribution 210 is below the read voltage 230). In other words, memory cells 105 in the SET state will "threshold" in response to the read voltage 230 being applied. On the other hand, memory cells 105 of the representative population that store the RESET state may not permit a flow of current when applying the read voltage 230, or may permit some flow of current that is below a threshold (e.g., a leakage current) because the read voltage 230 is below the threshold voltage for each of those memory cells 105 (e.g., because the distribution 220 is above the read voltage 230). In other words, memory cells 105 in the RESET state may not threshold in response to the read voltage 230 being applied. Thus, in some examples, the read voltage 230 may be referred to as, or otherwise be associated with a voltage demarcation (VDM), which may refer to a demarcation or other reference voltage or bias between the SET and RESET state for the representative population of memory cells 105.

The plot 200 may also be illustrative of various margins that may be applicable to access operations of the representative population of memory cells 105. For example, an "E3 margin" may refer to a difference between the edge 221 of the distribution 220 (e.g., a lower edge of a distribution associated with a logic state or material state having a relatively high threshold voltage) and the read voltage 230. Generally, an E3 margin may refer to the margin against inadvertently thresholding memory cells 105 in the RESET state with a given read voltage 230 (e.g., inadvertently detecting or interpreting a SET state when reading a memory cell 105 that should store the RESET state or was written with the RESET state). Accordingly, improving an E3 margin may be associated with widening a margin between the distribution 220 and a read voltage 230 (e.g., by shifting the read voltage 230 to a lower voltage, by shifting the edge 221 to a higher voltage, by shifting the distribution 220 to higher voltages).

In another example, an "E2 margin" may refer to a difference between the edge 212 of the distribution 210 (e.g., an upper edge of a distribution associated with a logic state or material state having a relatively low threshold voltage) and the read voltage 230. Generally, an E2 margin may refer to the margin against failing to threshold memory cells 105 in the SET state with a given read voltage 230 (e.g., inadvertently detecting or interpreting a RESET state when reading a memory cell 105 that should store the SET state or was written with the SET state). Accordingly, improving an E2 margin may be associated with widening a margin between the distribution 210 and a read voltage 230 (e.g., by shifting the read voltage 230 to a higher voltage, by shifting the edge 212 to a lower voltage, by shifting the distribution 210 to lower voltages).

In another example, an "E1 margin" may refer to a difference between the edge 211 of the distribution 210 (e.g., a lower edge of a distribution associated with a logic state or material state having a relatively low threshold voltage) and a voltage that may be related to the read voltage 230 or some other applied voltage (e.g., a write voltage, a rewrite voltage, a conditioning voltage). Generally, an E1 margin may refer to the margin against inadvertently thresholding non-target memory cells 105 (e.g., in the SET state) when biasing a target memory cell 105.

For example, to bias a target memory cell 105 with the read voltage 230, half of the relative bias may be associated with access lines 120 (e.g., word lines) and half of the relative bias may be associated with access lines 130 (e.g., bit lines). In one example, a target word line may be positively biased to half the read voltage 230 (e.g., $+V_{read}/2$) and non-target word lines may be grounded (e.g., 0 Volts), and a target bit line may be negatively biased to half the read voltage 230 (e.g., $-V_{read}/2$) and non-target bit lines may be grounded (e.g., 0 Volts). In another example, a target word line may be positively biased to the full read voltage 230 (e.g., $+V_{read}$) and non-target word lines may be positively biased to half the read voltage 230 (e.g., $+V_{read}/2$), and a target bit line may be grounded (e.g., 0 Volts) and non-target bit lines may be biased to half the read voltage 230 (e.g., $+V_{read}/2$). In either example, the target memory cell 105 may be biased to the full read voltage 230, and memory cells 105 that do not share either the target word line or the target bit line may have no net bias.

However, in either of the examples above, non-target memory cells 105 that share one of the target word line or the target bit line with the target memory cell 105 may have a net bias of half the read voltage 230, which may be relevant to the edge 211 of the distribution 210. For example, when non-target memory cells 105 that share a target word line or a target bit line store a SET state, they may be inadvertently thresholded by half the read voltage 230 (e.g., when an edge 211 has a voltage that is lower than $V_{read}/2$). Inadvertent thresholding of a non-target memory cell 105 may result in additional current flow along a target word line or target bit line, for example, which may cause read operation errors or inaccuracies, increased power consumption, and other adverse effects. Thus, in the illustrative example, an E1 margin may relate to how far the edge 211 is above half a read voltage 230. However, an E1 margin may additionally or alternatively relate to other access voltages as well, such as write voltages or selection voltages. Accordingly, improving an E1 margin may generally be associated with shifting the distribution 210 away from biasing that may be applied to a non-target memory cell 105 (e.g., by shifting the edge 211 to a higher voltage, by shifting the distribution 210 to higher voltages, by shifting biasing that may be applied to non-target memory cells 105 to a lower voltage).

In some memory devices 100, distributions of threshold voltages of a representative population of memory cells 105 (e.g., a distribution 210, a distribution 220, or both) may change or migrate over the course of operating the memory device 100. For example, as the representative population of memory cells 105 (e.g., the representative population of configurable material memory elements) accumulates cycles, such as access operations, or changes temperature, the ability of the memory cells 105 to develop a threshold voltage in response to a given write operation (e.g., having a particular pulse amplitude and duration) may increase. Additionally or alternatively, the response of the memory cells 105 to a given read operation (e.g., a read voltage, a read bias) may change over time, which may include a threshold voltage for the memory cells 105 being dependent on accumulated access operations or being dependent on ambient temperature or device operating temperature (e.g., bulk temperature). Accordingly, under such circumstances, the distributions of threshold voltages may increase or decrease (e.g., shift along a voltage axis) over time when the same write operation (e.g., write operations having the same parameters) is used.

In another example, the ability of the memory cells 105 to develop a threshold voltage in response to a given write operation (e.g., having a particular pulse amplitude and duration) may become more widely distributed over time. Additionally or alternatively, the response of the memory cells 105 to a given read operation (e.g., a read voltage, a read bias) may become more distributed over time, which may include a threshold voltage for the memory cells 105 being dependent on accumulated access operations or being dependent on bulk device temperature or local memory cell temperature. Accordingly, under such circumstances, the distributions of threshold voltages may spread out (e.g., span a greater range along a voltage axis) when the same write operation is used, such as migrating to a distribution having a shallower slope in the graph of sigma versus voltage.

The migration of threshold voltages of a representative population of memory cells 105 may be accompanied by a reduction in voltage margins for the associated memory device 100. For example, when edge 221 decreases in voltage (e.g., due to E3 migration), edge 221 may become closer to, or fall below the read voltage 230, illustrating a decrease, collapse, or elimination of an E3 margin. In another example, when edge 212 increases in voltage (e.g., due to E2 migration), edge 212 may become closer to, or move beyond the read voltage 230, illustrating a decrease, collapse, or elimination of an E2 margin. In another example, a decrease of edge 211 (e.g., E1 migration) may be accompanied by a decrease, collapse, or elimination of an E1 margin.

In accordance with aspects of the present disclosure, a read voltage 230 may be variable, and may be adjusted to compensate for various aspects of threshold voltage migration (e.g., in response to detected threshold voltage migration, in response to detected changes in a distribution of threshold voltages, based on other indications of identified or predicted aging, wear, temperature changes), or other effects. For example, the read voltage 230 may be determined based at least in part on detecting an average of the distribution 210 (e.g., an average of or middle point between the edge 211 and the edge 212, or proxy thereof), or based at least in part on detecting a span of the distribution 210 (e.g., a difference between the edge 212 and the edge 211, or proxy thereof), or based on a combination of both. Such a determination of the read voltage 230 may be referred to as a distribution-following read voltage, and may be implemented as a measure to compensate for changes in the distribution 210 over the course of operating a memory device 100.

Figure 3:
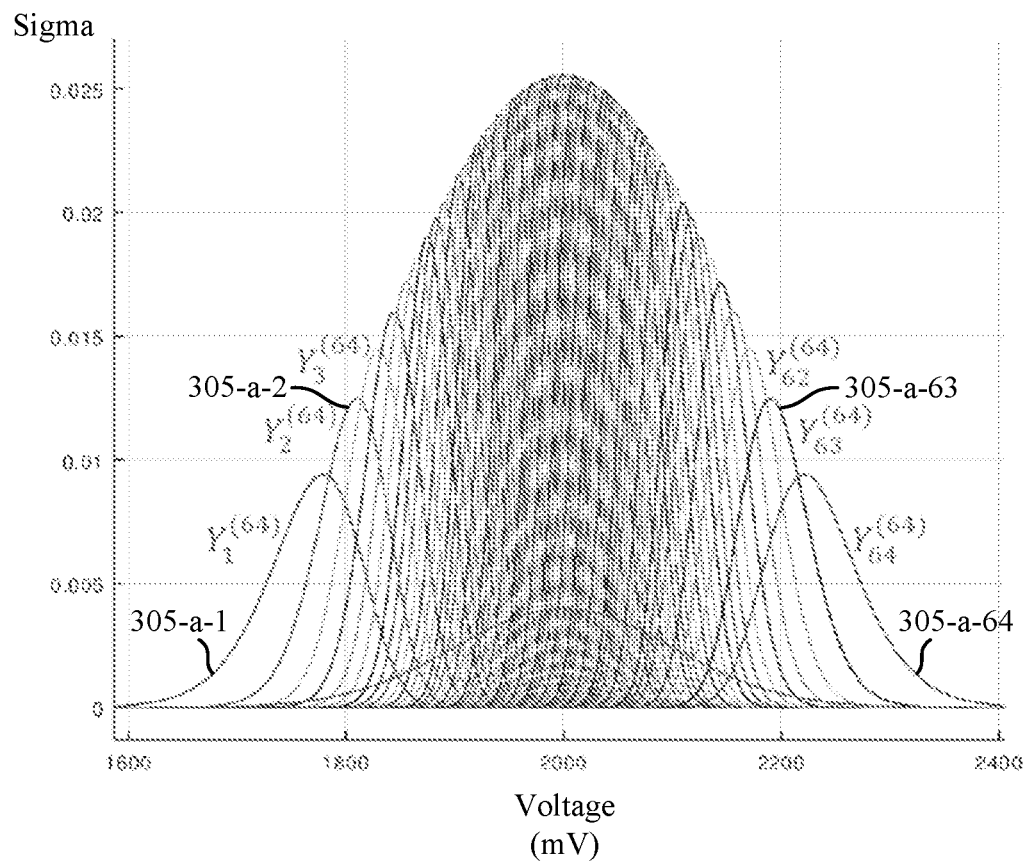
FIG. 3 illustrates a plot of threshold voltage distributions for a set of memory cells storing a logic state that may support distribution-following access operations in accordance with examples as disclosed herein.

FIG. 3 illustrates a plot 300 of threshold voltage distributions for a set of memory cells 105 storing a logic state that may support distribution following access operations in accordance with examples as disclosed herein. The plot 300 illustrates respective distributions 305 for activations of 64 memory cells 105 of a representative population of memory cells 105 (e.g., a representative population of configurable material memory elements) of a memory device 100.

In the example of plot 300, each of the distributions 305 are illustrated as probabilities with respect to a standard deviation (e.g., a Gaussian distribution) for various voltages. For example, the distribution 305-a-1 may illustrate a statistical distribution of voltages for which a first of the 64 activations may occur (e.g., $Y_1^{(64)}$), the distribution 305-a-2 may illustrate a statistical distribution of voltages for which a second of the 64 activations may occur (e.g., $Y_2^{(64)}$), and so on. In some examples, the distributions 305 may be illustrative of individual activations (e.g., thresholding events, switching events) for a set of 64 memory cells 105 storing a particular logic state (e.g., a SET state), with the collective threshold voltages of the 64 memory cells distributed in accordance with a distribution 210 described with reference to FIG. 2. The plot 300 may be referred to as a power density function (PDF) of order statistics for n=64, where n is a subset of a representative population N having a mean, $\mu$, of 2000 mV and a standard deviation, $\sigma$, of 100 mV (e.g., according to a distribution 210 having such characteristics).

In some examples, a read operation or other biasing operation may be applied with a ramped, stepped, or otherwise increasing bias across each of a set of memory cells 105 (e.g., as a shared or common biasing). Thus, memory cells 105 storing a SET state and having threshold voltages distributed according to a distribution 210 may be activated (e.g., thresholded) according to a sequence of activations, and the plot 300 may illustrate an example of probabilities of voltages associated with particular instances of the sequence of activations. Although illustrated relative to a voltage axis, a ramped, stepped, or otherwise increasing biasing may be used (e.g., applied to the set of 64 memory cells 105) to convert or otherwise interpret the plot 300 as a time-domain or sequential distribution (e.g., a plot of distributions 305 corresponding to sigma versus time of a biasing operation, a plot of distributions 305 corresponding to a sequence of activations from left to right). In accordance with the described techniques, a memory device 100 may detect aspects of distributions such as those illustrated in plot 300 to control access operation parameters, which may enable the memory device 100 to compensate for changes in a distribution 210 or distributions 305 over time.

In an illustrative example, a population of N memory cells 105 may be divided into a first set having a first logic state (e.g., written with a RESET state) and a second set having a second logic state (e.g., written with a SET state), where the sets may be referred to as time event or time domain populations $X_i$ that are naturally ordered $Y_j$ by a biasing operation (e.g., a biasing having a ramped voltage, a biasing having stepped voltage). For example, an encoding or padding process may applied to a population of memory cells 105 (e.g., a page of memory cells 105, a row of memory cells 105) such that a quantity of memory cells 105 in the first set and a quantity of memory cells 105 in the second set is known, or a ratio between the quantity of memory cells 105 in the first set and a quantity of memory cells 105 in the second set is known (e.g., predetermined, determined or otherwise configured prior a write operation on the population of memory cells 105). In one example, a population may consist of N=128 memory cells 105 (e.g., a page of 128 memory cells 105), and each of the first set and the second set may consist of 64 memory cells. In some examples, an encoding or padding process may be applied to support a write operation in which, of a population of 128 memory cells 105, 64 memory cells 105 are written with a SET state (e.g., n=64), and 64 memory cells 105 are written with a RESET state. In other examples, an encoding or padding process may be applied to a population of memory cells 105 such that at least half the population is included in the first set, or at least half the population is included in the second set, or any other quantity or ratio of members in the first set or second set.

In some examples, conditions of a biasing operation (e.g., a voltage of a ramped or stepped biasing operation, a time of a ramped or stepped biasing operation) associated with a particular activation, or set of activations, may be used to determine conditions of an access operation for distinguishing between memory cells 105 storing a first logic state and memory cells 105 storing a second logic state (e.g., to determine a voltage 230 as described with reference to FIG. 2, or a related aspect of a read operation such as a time or duration of a read operation). In some examples (e.g., according to a time domain estimation), mean estimation or distribution estimation may be performed by using an order statistic of the switching times $X_i$, of the memory cells 105.

For example, a particular activation of a set of activations, such as a particular one of the activations associated with a distribution 305, may be used as a proxy for estimating a mean of a distribution (e.g., of a distribution 210) corresponding to a particular logic state (e.g., a SET state). An estimation of conditions for an activation corresponding to an ordered event $Y_{j_o}$ may be equivalent to the mean of the distribution for the ordered event, and may be given by:

$$E[Y_{j_o}] = \mu_{j_o} = \mu + b_{j_o} \quad (1)$$

where $\mu$ may correspond to the mean of the set of memory cells 105 (e.g., a mean of a distribution 210, a mean in the time domain of a ramped or stepped biasing operation), and $b_{j_o}$ may correspond to a known or predicted offset (e.g., a probabilistic offset) between the mean of the set and the mean for the particular ordered event, $Y_{j_o}$ (e.g., according to statistics of normal distributions). In some examples, to support a relatively precise estimation of the mean of the set, there may be an optimal ordered event, $Y_{j_o}$, such that:

$$\mathrm{var}[Y_{j_o}] = \sigma_{j_o}^2 \ll \sigma^2 \quad (2)$$

In other words, an optimal ordered event, $Y_{j_o}$, for estimating a mean threshold voltage for a set of memory cells 105 (e.g., in a SET state) may be associated with a variance for the ordered event being less than the variance of the population as a whole, which may correspond to the event $Y_{j_o}$ being a relatively accurate estimator of the mean thresholding conditions of the biasing operation for the distribution 210 (e.g., for using the event $Y_{j_o}$ to estimate the mean, $\mu$, of the SET distribution 210).

In some examples, an activation event $Y_{j_o}$ having a low variance with respect to estimating a mean threshold voltage may correspond to a middle or relatively central event in the set of activations. For example, of a set of 64 memory cells 105 (e.g., in the SET state), an event having a relatively low variance may be a $32^{nd}$ or $33^{rd}$ activation or thresholding event. However, in other examples, an earlier event may be selected, such as a 20th event, because a gap between such an event and a mean of a distribution (e.g., a distribution 210) may be fixed, or otherwise relatively stable or predictable among a normal distribution of characteristics (e.g., according to a value $b_{j_o}$). Thus, such a difference may be compensated for by known or estimated relationships, and by selecting an earlier event, a controller or circuitry used for determining aspects of an access operation may have more time to perform various operations (e.g., compared to when a middle activation event or later activation event is used for such determinations). However, in some cases, it may be preferable to select a middle or relatively central event, because other events may be associated with a relatively higher variance (e.g., a relatively higher dispersion of an estimator, even if the dispersion is a weak function of the order index, j). Although described in the context of a determination from single ordered event, mean estimation may also be performed using respective statistics or conditions related to more than one ordered event, such as taking an average of two ordered events that are estimated to be on opposite and symmetric sides of a distribution about a mean, or two ordered events that are estimated to have known offsets or other characteristics from a mean of a population.

Various offsets may be applied to an estimated mean of a set of memory cells 105 to determine a reference condition (e.g., a voltage 230) for an access operation, such as a biasing condition to distinguish between a SET distribution (e.g., a distribution 210) and a RESET distribution (e.g., a distribution 220) of a population of memory cells 105. Such offsets may be applied in the voltage domain, or in the case of a ramped, stepped, or otherwise increasing biasing, such offsets may be applied in the time domain. In some examples, such offsets may be based at least in part on detecting or predicting aspects of a width of a distribution 210, a collective width of a set of distributions 305, or some other measure or proxy of such a width or distribution of population characteristics. For example, such offsets applied to an estimated mean may be determined based at least in part on detecting biasing conditions corresponding to two different activations or thresholding events (e.g., two different ordered events, two different activations associated with two different distributions 305 of the plot 300), where such operations may be referred to as or otherwise included in a sigma follower.

In one example, an estimate of a standard deviation, $\sigma$, for a set or population of memory cells 105 may be based on a detected or identified difference, $Z_{i,j}$, in conditions between ordered events:

$$Z_{i,j} = Y_j - Y_i \quad (3)$$

where $Y_i$ and $Y_j$ refer to conditions of proper time events (e.g., activations of memory cells 105 in response to a ramped or stepped biasing operation over time), and i<j (e.g., activation event i occurs before activation event j). In other words, the two order statistics $Y_i$ and $Y_j$ may be used to estimate the standard deviation, $\sigma$, of the distribution in order to establish (e.g., in a closed loop operation, according to a follower operation) a half width contribution of a SET distribution (e.g., a distribution 210). In an illustrative example, an event index i may be chosen to be equal to 10 and an event index j may be chosen to be equal to 50, such that the difference, $Z_{i,j}$, may refer to a difference in conditions of a biasing operation between a $10^{th}$ activation and a $50^{th}$ activation.

In some examples (e.g., according to Gaussian distributions), distributions of ordered statistics may be known, and a distribution for an event $Y_i$ (e.g., a distribution 305) may be given by:

$$f_{Y_i}(x) = \frac{n!}{(i-1)!(n-i)!}[F(x)]^{i-1} f(x)[1-F(x)]^{n-i} \quad (4)$$

where F(x) may refer to a cumulative distribution function (e.g., a cumulative distribution of memory cells in a SET state, a SET distribution, a distribution 210), where a mean of the cumulative distribution F(x) and its standard deviation may be characterized or known. In various examples, the cumulative distribution F(x) may be a Gaussian distribution or some other distribution that may or may not be Gaussian. Moreover, in some examples, two different order statistics $Y_i$ and $Y_j$ may not be independent, but may be related. For example, joint distributions for events $Y_i$ and $Y_j$ may be given by:

$$f_{Y_i,Y_j}(x) = \frac{n!}{(i-1)!(j-i-1)!(n-j)!}[F(x)]^{i-1} \quad (5)$$
$$f(x)[F(y)-F(x)]^{j-i-1}f(y)[1-F(y)]^{n-j}$$

In some examples, joint distributions of ordered events may be used for selecting which of two ordered events should be used to estimate various aspects of a distribution 210 or distributions 305. For example, the estimate of the difference between events $Y_i$ and $Y_j$ may be equal to the difference of the estimate of each event, as given by:

$$E[Z_{i,j}]=E[Y_j]-E[Y_i] \quad (6)$$

According to normal distributions, the variance of such an estimate of the difference between events $Y_i$ and $Y_j$ may be given by the following:

$$\text{var}[Z_{i,j}]=\int_{-\infty}^{+\infty}(z-E[Z_{i,j}])^2 f_{Z_{i,j}}(z)dz, \quad \text{where}$$
$$f_{Z_{i,j}}(z)=\int_{-\infty}^{+\infty}f_{Y_i,Y_j}(x,z+x)dx \quad (7)$$

In various examples, to improve the estimation of the standard deviation, σ, from the difference, $Z_{i,j}$, events i and j may be selected or determined to minimize variance with respect to the difference, $Z_{i,j}$, or combine variance considerations with other considerations, such as maintaining a variance below a threshold while also supporting computation following an event j and other operations. In other words, events i and j may be selected according to various considerations for estimating a difference, $Z_{i,j}$, used to estimate a spread or standard deviation of a set of memory cells 105 (e.g., in a SET state).

Figure 4:
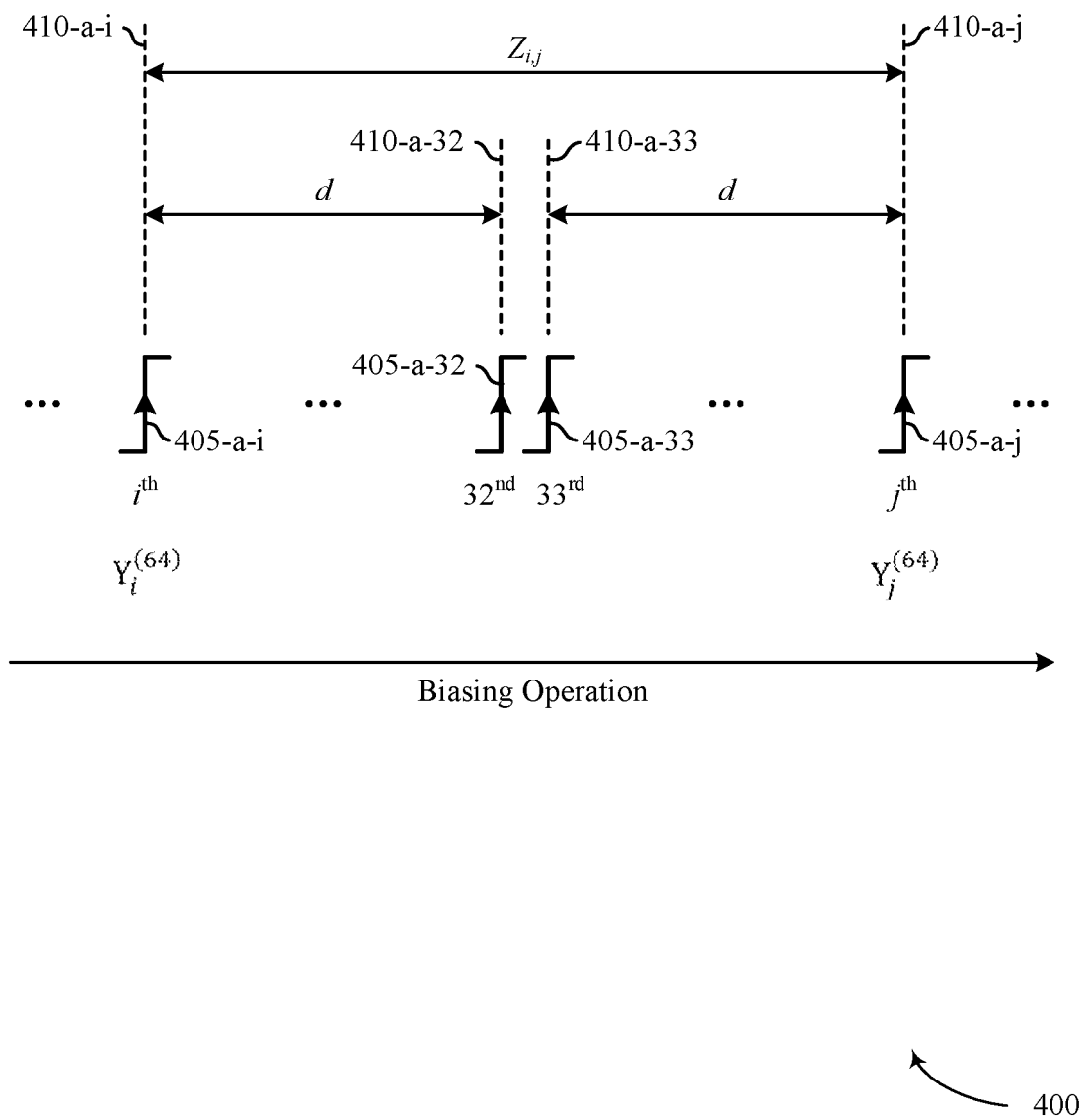
FIG. 4 illustrates an example of activation events of a biasing operation that may support distribution-following access operations for a memory device in accordance with examples as disclosed herein.

FIG. 4 illustrates an example 400 of activation events 405-a of a biasing operation that may support distribution-following access operations in accordance with examples as disclosed herein. The example 400 may illustrate a symmetric approach (e.g., relative to a distribution mean) for estimating a spread or standard deviation, σ, of a set of 64 memory cells 105, which may be used for determining conditions for an access operation in the voltage domain or the time domain.

The activation events 405-a may refer to ordered activations or thresholding events of respective memory cells 105 in response to the biasing operation. For example, the activation event 405-a-i may correspond to an $i^{th}$ thresholding of a memory cell 105 (e.g., of the set of 64 memory cells), the activation event 405-a-32 may correspond to a $32^{nd}$ thresholding of a memory cell 105, the activation event 405-a-33 may correspond to a $33^{rd}$ thresholding of a memory cell 105, and the activation event 405-a-j may correspond to a $j^{th}$ thresholding of a memory cell 105. In some examples, a memory device 100 may identify the activation events 405 by detecting current through a respective memory cell 105, or detecting current above a threshold (e.g., detecting that a respective memory cell 105 has thresholded). In some examples, a memory device 100 may identify an order or index for each of the activation events 405-a (e.g., identifying that the activation event 405-a-i is an $i^{th}$ activation event of the biasing operation), or otherwise count or accumulate a quantity of the activation events 405-a, and use the identified order, index, or count as part of determining conditions for an access operation that may include the biasing operation, or may follow the biasing operation.

Each of the activation events may correspond to a respective condition of the biasing operation. For example, the $i^{th}$ activation event 405-a-i may correspond to a condition 410-a-i, the $32^{nd}$ activation event 405-a-32 may correspond to a condition 410-a-32, the $33^{rd}$ activation event 405-a-33 may correspond to a condition 410-a-33, and the $j^{th}$ activation event 405-a-j may correspond to a condition 410-a-j. In various examples, each of the conditions 410 may refer to a time of the biasing operation, a voltage of a biasing operation, or some combination thereof (e.g., according to parameters of a ramped biasing operation or stepped biasing operation). In some examples, a memory device 100 may identify the conditions 410-a corresponding to one or more of the activation events 405-a (e.g., identifying the condition 410-a-1 that corresponds to the $i^{th}$ activation event 405-a-i), or identify a difference between conditions 410-a corresponding to a particular pair of activation events 405-a, and use the identified conditions 410-a or differences thereof as part of determining conditions for an access operation (e.g., a reference voltage, a duration, a time offset, a completion time). For example, a memory device 100 may determine the difference, $Z_{i,j}$, which may refer to the difference between the condition 410-a-i and the condition 410-a-j of the biasing operation (e.g., a symmetric difference about a mean of the distribution). In some examples, the difference, $Z_{i,j}$, may be used to estimate the standard deviation, σ, of the set of memory cells (e.g., in the SET state), or otherwise determine an offset (e.g., from a mean, from a particular activation event 405) for a parameter of an access operation.

In the example 400, events i and j may be symmetric with respect to a mean condition of a set having n events, and may be generally given by:

$$i = \frac{n}{2} - d, \; j = \frac{n}{2} + 1 + d \quad (8)$$

where d may refer to or be generally related to a distance from a mean or otherwise middle one of the set of events, such as a distance in quantity of activation events 405-a. In some examples, the distance d may refer to or otherwise correspond to a distance in the time domain or a distance in the voltage domain (e.g., according to normal distributions, according to parameters of the biasing operation). In the example 400, having an even number of events (e.g., n=64), the events i and j may be symmetric about a mean that is between the $32^{nd}$ and $33^{rd}$ events. In examples with an odd number of events, events i and j may be symmetric about a single event.

By using the symmetric approach of the example 400, the selection of two different activation events 405-a on opposite sides of a mean of a distribution may support a relatively accurate or precise estimation of the spread or standard deviation of the set of memory cells 105 (e.g., from $Z_{i,j}$). However, in the approach of example 400, both sides of the distribution are explored, which may require relatively longer duration or a relatively later time of a biasing operation for activations to accumulate. Thus, calculations or operations related to distribution-following access operations may be relatively delayed when using the approach of example 400, but in some examples may be more accurate or less susceptible to variance.

Figure 5:
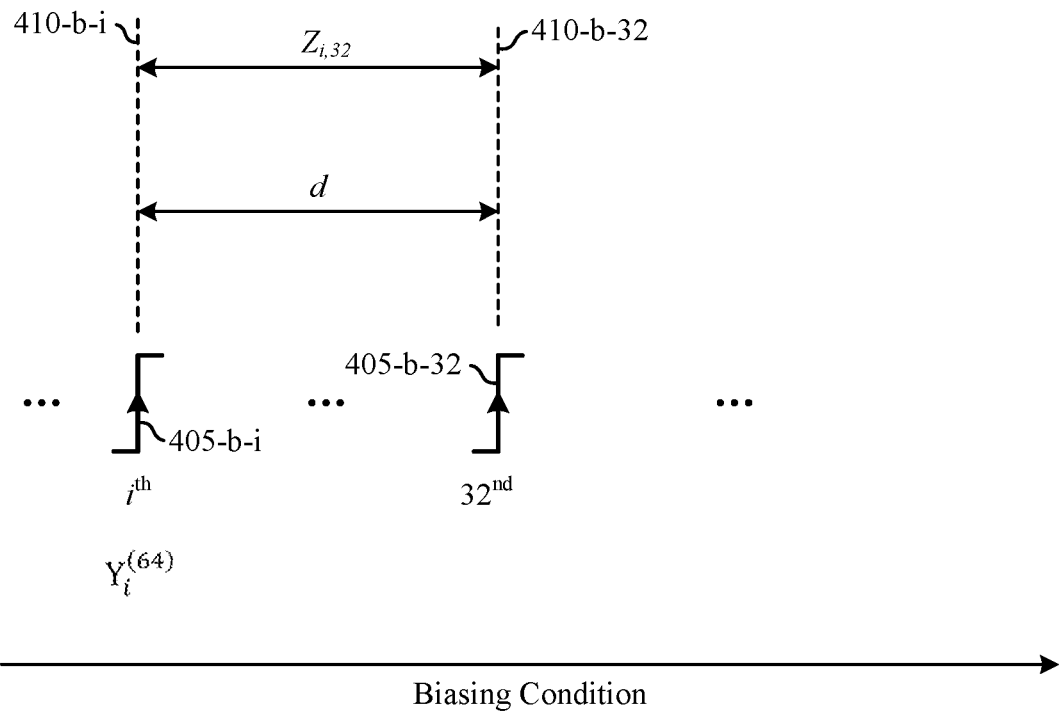
FIG. 5 illustrates an example of activation events of a biasing operation that may support distribution-following access operations for a memory device in accordance with examples as disclosed herein.

FIG. 5 illustrates an example 500 of activation events 405-b of a biasing operation that may support distribution-following access operations in accordance with examples as disclosed herein. The example 500 may illustrate an asymmetric approach (e.g., relative to a distribution mean) for estimating a spread or standard deviation, σ, of a set of 64 memory cells 105, which may be used for determining conditions for an access operation in the voltage domain or the time domain.

The activation events 405-b may refer to ordered activations or thresholding events of respective memory cells 105 in response to the biasing operation. For example, the activation event 405-b-i may correspond to an $i^{th}$ thresholding of a memory cell 105 (e.g., of the set of memory cells 105), and the activation event 405-b-32 may correspond to a $32^{nd}$ thresholding of a memory cell 105 (e.g., where the index j as used herein may be equal to 32, and refer to a middle or generally central activation event 405, rather than a later activation event 405 such as in the example 400). In some examples, a memory device 100 may identify the activation events 405-b by detecting current through a respective memory cell 105, or current above a threshold (e.g., detecting that a respective memory cell 105 has thresholded). In some examples, a memory device 100 may identify an order or index for each of the activation events 405-b (e.g., identifying that the activation event 405-b-i is an $i^{th}$ activation event of the biasing operation), or otherwise count or accumulate a quantity of the activation events 405-b, and use the identified order, index, or count as part of determining conditions for an access operation that may include the biasing operation, or may follow the biasing operation.

Each of the activation events may correspond to a respective condition of the biasing operation. For example, the $i^{th}$ activation event 405-b-i may correspond to a condition 410-b-i, and the $32^{nd}$ activation event 405-a-32 may correspond to a condition 410-a-32. In various examples, each of the conditions 410-b may refer to a time of the biasing operation, a voltage of a biasing operation, or some combination thereof (e.g., according to parameters of a ramped biasing operation or stepped biasing operation). In some examples, a memory device 100 may identify the conditions 410-b corresponding to one or more of the activation events 405-b (e.g., identifying the condition 410-b-1 that corresponds to the $i^{th}$ activation event 405-b-i), or identify a difference between conditions 410-b corresponding to a particular pair of activation events 405-b, and use the identified conditions 410-b or differences thereof as part of determining conditions for an access operation (e.g., a reference voltage, a duration, a time offset, a completion time). For example, a memory device 100 may determine the difference, $Z_{i,32}$, which may refer to the difference between the condition 410-b-i and the condition 410-b-32 of the biasing operation (e.g., an asymmetric difference about a mean of the distribution). In some examples, the difference, $Z_{i,32}$ may be used to estimate the standard deviation, σ, of the set of memory cells (e.g., in the SET state), or otherwise determine an offset (e.g., from a mean, from a particular activation event 405-b) for a parameter of an access operation.

In the example 500, event i may be asymmetric with respect to a set having n events, and may be generally given by:

$$i = \frac{n}{2} - d \quad (9)$$

where d may refer to or be generally related to a distance from a mean or otherwise middle one of the set of events, such as a distance in quantity of activation events 405-b. In some examples, the distance d may refer to or otherwise correspond to a distance in the time domain or a distance in the voltage domain (e.g., according to normal distributions, according to parameters of the biasing operation).

By using the asymmetric approach of the example 500, the selection of an activation event 405 prior to a mean or central portion of the distribution may allow various calculations or operations to be completed more quickly than if an activation event 405 after a mean or central portion of the distribution is used. In other words, in the approach of example 500, one side (e.g., half) of the distribution may be explored, which may require relatively shorter time than the example 400. Thus, although the example 500 may be relatively less accurate or precise for estimating a distribution than the example 400, the example 500 may support calculations or operations related to distribution-following access operations to be completed more quickly.

In general (e.g., in either of the example 400 or the example 500), selecting values of i and j that are relatively far apart (e.g., with a relatively large distance, d) may span a relatively greater range of the distribution of memory cells 105 (e.g., a larger difference, $Z_{i,j}$), but individual values (e.g., conditions of the biasing operation for the respective activation events 405), which may be near the tails of a distribution 210, may have a relatively large standard distributions or variance, and accordingly be associated with a relatively large variance in $Z_{i,j}$. On the other hand, selecting values of i and j that are relatively close together (e.g., with a relatively small distance, d) may correspond to individual values having relatively small distributions or variance, and accordingly be associated with a relatively small variance in $Z_{i,j}$. However, the relatively small value of $Z_{i,j}$ compared to the overall distribution (e.g., overall spread or span, such as a span of a distribution 210) may mean that small changes to the difference, $Z_{i,j}$, may have a larger effect on the estimation of spread or standard deviation, μ, of the population. Thus, it may be beneficial to select values for i and j by selecting a value of the distance, d, that minimize overall variance, such as minimizing a ratio of the standard deviation of the difference, $Z_{i,j}$, and the mean of the difference $Z_{i,j}$ (e.g., minimizes $\sigma_Z^{(n)}(d)/\mu_Z^{(n)}(d)$).

In one example, a random variable S may be used to inform the selection of i and j, or the selection of d, where S may be defined as:

$$S = \alpha_{i,j} Z_{i,j} \quad (10)$$

and $$\alpha_{i,j} = \frac{\sigma}{\mu_{Z_{i,j}}(\sigma)}$$

In general, the ratio of $\alpha_{i,j}$ may be constant with $\sigma$, thus, $\mu_{Z_{i,j}}(\sigma)$, or more generally $Z_{i,j}$, may be used to estimate $\sigma$. An optimal or otherwise favorable couple may be formed when $\sigma_S$ is relatively smaller, where $\sigma_S$ may be defined by:

$$\sigma_S = \alpha_{i,j}\sigma_{Z_{i,j}} = \frac{\sigma}{\mu_{Z_{i,j}}}\sigma_{Z_{i,j}} = \sigma\frac{\sigma_{Z_{i,j}}}{\mu_{Z_{i,j}}} \quad (11)$$

Thus, a minimum $\sigma_S$ may be obtained when $\sigma_{Z_{i,j}}/\mu_{Z_{i,j}}$ assumes a minimum value. According to normal distributions, in the example 400 having a symmetric approach, such conditions may be met for a set of n=64 memory cells 105 when d=27 (e.g., i=5, j=60), and in the example 500 having an asymmetric approach, such conditions may be met for a set of n=64 memory cells 105 when d=28 (e.g., i=4, j=32).

Although described in the context of a set of 64 memory cells 105, the described techniques may be applicable to other quantities of memory cells 105 for determining which activation events 405 are to be used to estimate a spread or standard deviation of threshold characteristics of memory cells 105 in a particular state. For example, optimal indices i and j for a set of 128 memory cells 105 (e.g., in a SET state) or a set of 128 activations may be different than the optimal indices for a set of 64 memory cells 105. In various examples, the determination of indices i and j, or a determination of whether to use a symmetric approach or an asymmetric approach, may be preconfigured, or may be dynamically determined by a memory device 100 (e.g., based on a quantity of memory cells 105 in a set or population, based on a quantity or ratio of logic states for a write operation or an encoding scheme, based on an operating mode of a memory device 100).

Using the described techniques for sigma following, if a for a set of memory cells 105 or a related set of activations changes over time, the change can be followed by using an approximation of $S=\alpha Z$. In some examples, for a quantity of memory cells 105 or activations with n=64, optimal indices may be equal to i=5 and j=60, corresponding to d=27 in the symmetric approach (e.g., of example 400), where:

$$\left.\frac{\sigma_Z}{\mu_Z}\right|_{min} = 0.109 \quad (12)$$

and in such an example, $\alpha = \sigma/\mu_Z \approx 0.34$. Consequently, a half width of the distribution, h, may be estimated by evaluating the following:

$$H = 3.54 \cdot S = 3.54 \cdot \alpha Z = 1.2 \cdot Z \quad (13)$$

where the corresponding standard deviation or estimation error may be given by:

$$\sigma_H = 3.54\sigma\frac{\sigma_Z}{\mu_Z} = 3.54 \cdot 0.109\sigma = 0.385\sigma \quad (14)$$

where, referring to the example of plot 300, $\sigma$=100 mV, $\sigma_H$=38.5 mV, and h=354 mV.

Accordingly, a sigma follower methodology in accordance with the described examples may be summarized as including a measurement of a difference (e.g., a delay, a voltage difference) in conditions, Z, estimating a half width $h=3.54\sigma$ with $H=1.2 \cdot Z$, and estimate H according to $E[H]=h$, with the result of $\sigma_H$ being equal to $0.385\sigma$. Although the examples above refer to particular indices of a set of 64 memory cells 105 or corresponding activations or threshold events, the described techniques may be applied to other indices as well. For example, when using different values for i and j, a multiplier applied to a determined difference between respective conditions for activations $Y_i$ and $Y_j$ (e.g., for calculating H) may be different than 1.2, and a multiplier for an estimated standard deviation or estimation error (e.g., for calculating $\sigma_H$) may be different than 0.385, and may be related to relationships of normally distributed events or Gaussian distributions of characteristics. More generally, it may be understood that, in accordance with the techniques described herein, a distribution of a set of activation events (e.g., a distribution of threshold voltages of a set of memory cells 105), and accordingly a parameter of an access operation associated with the set (e.g., a read operation for detecting a logic state of respective memory cells 105 set), may be determined based at least in part on a difference between detected or determined conditions of a biasing operation corresponding to different activation events 405 of the set.

Figure 6:
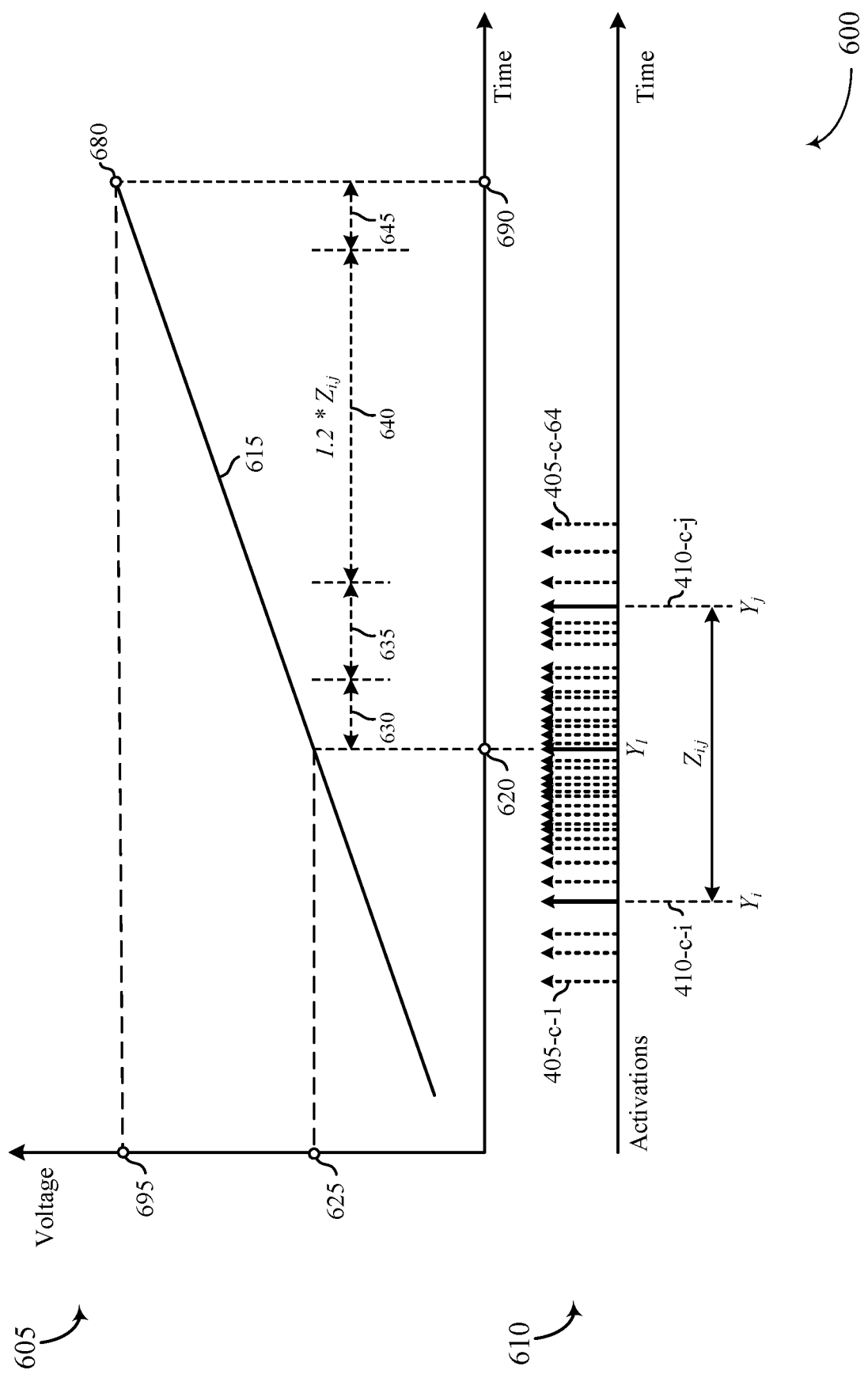
FIG. 6 illustrates a schematic view of a methodology that may support distribution-following access operations for a memory device in accordance with examples as disclosed herein.

FIG. 6 illustrates a schematic view of a methodology 600 that may support distribution-following access operations for a memory device in accordance with examples as disclosed herein. The methodology 600 is illustrated with reference to a biasing plot 605 showing a biasing 615 having a voltage that increases over time, and a corresponding activation plot 610 showing a set of activation events 405-c occurring at respective conditions (e.g., times, voltages) of the biasing 615. The methodology 600 may illustrate an example for determining a parameter of an access operation based at least in part on a difference between conditions of the biasing 615 corresponding to activation indices i and j as described herein. In various examples, the biasing 615 may or may not be part of an access operation (e.g., a read operation that includes the activation events 405-c).

In the example of methodology 600, the biasing 615 is shown as a ramped voltage, but other examples of the described techniques may use a stepped biasing or other biasing that increases over time. In response to the biasing 615, different ones of the set of memory cells 105 may experience an activation event 405-c (e.g., a thresholding) at respective conditions (e.g., time, voltage) of the biasing 615. The activation events 405-c may be distributed according to a normal or Gaussian distribution, such as a distribution 210 described with reference to FIG. 2 (e.g., for a set of memory cells 105 written with a SET state) or the distributions 305 described with reference to FIG. 3.

In some examples, the methodology 600 may include identifying a middle or central activation event 405-c of the ordered sequence, which may be referred to as $Y_I$. In some examples, the activation event of $Y_I$ may be used to estimate a mean of the distribution of memory cells 105 or a mean of the activation events 405-c. Referring to the example 400, the event $Y_I$ may correspond to an activation index of 32 or 33 (e.g., of 64 memory cells 105 in a SET state, of 64 anticipated activations), or more generally, may be equal to or nearest to an index equal to n/2. In other examples, the event $Y_I$ may be relatively separated from a central portion of a distribution, such as an activation index of l=20, in which case various offsets may be applied identify a mean of the distribution of activation events 405-c. The identification of the activation of $Y_I$ may be used to support the determination of a parameter for an access operation in the time domain or in the voltage domain. For example, the determination of the parameter may be based at least in part on a time 620 corresponding to an activation time of an average memory cell 105 of the set, based at least in part on a voltage 625 corresponding to an activation voltage (e.g., threshold voltage) of an average memory cell 105 of the set, or both.

In some examples, the methodology 600 may include identifying distributed activations events 405-c of the ordered sequence, such as activation events 405-c-i and 405-c-j, which may be referred to as events $Y_i$ and $Y_j$ (e.g., corresponding to activation indices i and j as described herein). In some examples, the activation events of $Y_i$ and $Y_j$ may be used to estimate a standard deviation, width, or half width of the distribution of memory cells 105 or the activation events 405-c. Referring to the example 400, the events of $Y_i$ and $Y_j$ may correspond to activation indices 5 and 60 (e.g., of 64 memory cells 105 in a SET state, of 64 anticipated activations), which may refer to indices associated with an optimal or otherwise favorable couple for the described conditions. The identification of the activation events 405-c-i and 405-c-j may be used to support the determination of a parameter for an access operation in the time domain or in the voltage domain. For example, identifying the activation events 405-c-i and 405-c-j may support the determination of the difference, $Z_{i,j}$, corresponding to a difference of conditions of the biasing 615 related to the respective activation events 405-c-i and 405-c-j. Although the difference, $Z_{i,j}$, is illustrated as a difference along the time axis (e.g., in the time domain), a determination of the difference, $Z_{i,j}$, may also be made along the voltage axis (e.g., in the voltage domain) to support various aspects of the described techniques. In some examples, the events of $Y_i$ and $Y_j$ may also be used to estimate a mean of the distribution (e.g., in place of using the event the event of $Y_l$).

The determination of the difference, $Z_{i,j}$, may support the determination of a parameter for an access operation, which may be related to the condition 680 illustrated in the biasing plot 605 (e.g., a final condition of the biasing 615, a final condition of an access operation that includes the biasing 615). For example, in the time domain, the condition 680 of the biasing 615 may be related to a time 690, which may correspond to an end time or duration of a biasing that may be used in an access operation (e.g., a read operation). The time 690 may be determined as a summation or accumulation of times or durations relative to the time 620, corresponding to a time of the biasing 615 associated with a mean or middle activation event 405-c. For example, the summation may include a duration 640 corresponding to a half width of the SET distribution. In some examples, the half width may be determined based at least in part on the difference, $Z_{i,j}$, such as being equal to H=1.2·Z (e.g., for n=64, i=5, and j=60).

In various examples, a summation or accumulation to determine a time 690 may or may not include parameters in addition to the duration 640 that is based at least in part on the difference $Z_{i,j}$. For example, as illustrated in the methodology 600, the summation may include one or more of a duration 630 related to a bias duration or offset, a duration 635 related to an uncertainty duration or offset, or a duration 645 related to a margin duration or offset.

In some examples, the duration 630 may be related to a bias (e.g., in time, in voltage) between a particular indexed event and a mean of the distribution. For example, a bias associated with a duration 630 may be relatively small bias when an index l corresponds to a 32nd event of 64 total events, or may be relatively larger when an index l corresponds to a 20th index of 64 events. In some examples, a duration 630 may be defined by, or otherwise related to a term $b_{j0}$ of Equation (1). In other words, a duration 630 may refer to a time (e.g., a delay) between an event chosen as a reference and event that represents a mean or average condition.

In some examples, the duration 635 may be related to an uncertainty of the calculated or determined mean (e.g., an uncertainty of the time 620), which may be equal to or otherwise related to a standard deviation of the probability distribution function associated with the event $Y_l$ (e.g., a standard deviation of a distribution 305-a-l of the plot 300) for the described case of 64 bits having the SET state. For example, the duration 635, or a corresponding voltage, may correspond to a value $\sigma_H$, which may be related to or otherwise determined or estimated from the standard deviation of the distribution as a whole. For example, according to the described example of applying Equation (14), $\sigma_H$ may be equal to 0.385σ.

Although the summation of durations is illustrated with reference to a mean or otherwise central time (e.g., of the event $Y_l$), in other examples, a summation of durations may be applied to a condition of another event, such as a summation or accumulation from one of events $Y_i$ or $Y_j$, or a summation or accumulation from another event such as $Y_{20}$ that is separated from a central time. Moreover, although the methodology 600 is illustrative of a time domain summation or accumulation, the condition 680 may also be determined in the voltage domain, corresponding to a voltage 695 that may be used as a parameter for an access operation (e.g., as a final voltage, as a peak voltage, as a maximum voltage, as a reference voltage, as a voltage 230 described with reference to FIG. 2). For example, a half width of a distribution may be determined as a hybrid estimation (e.g., in a voltage domain), such as a unit linear combination between a number from a characterization and an estimated value H from a difference $Z_{i,j}$, For example, a hybrid estimator K may be defined as:

$$K=\alpha*(354\ mV)+(1-\alpha)*H \quad (15)$$

where the value of 354 mV may refer to a predicted or preconfigured value or characterization (e.g., according to the example of h described with reference to Equation (14)), and a may refer to an engineering parameter between 0 and 1 selected to define a relative weighting of factors by the hybrid estimator. In some examples, such an approach may mitigate a dispersion of H while preserving the dependence on a distribution enlargement.

Thus, in accordance with aspects of the present disclosure, a memory device 100 may initiate a biasing operation (e.g., biasing 615) on a set of memory cells 105. The memory device 100 may identify an activation, $Y_i$, at a first condition of the biasing operation, and identify an activation, $Y_j$, at a second condition of the biasing operation. The memory device 100 may subsequently determine a parameter of an access operation based at least in part on a difference, $Z_{i,j}$, between the first condition and the second condition.

In some examples, the access operation may include the biasing operation (e.g., may include the activation events 405-c), and the determined parameter may include determining a final voltage of the biasing operation (e.g., a peak voltage of the biasing 615), which may correspond to a reference voltage of the access operation (e.g., determining a voltage 230, as described with reference to FIG. 2, as being equal to voltage 695, as described with reference to FIG. 6). In some examples, the determined parameter may include determining a duration or completion time for the biasing operation (e.g., the time 690), which may correspond to a duration or completion time for the access operation (e.g., for applying a demarcation voltage to one or more memory cells 105 to determine a logic state stored by the memory cells)

In some examples, the memory device 100 may modify the access operation (e.g., update a parameter of the access operation) based on the determined parameter. For example, a memory device 100 may perform the biasing 615 during an initialization or diagnostic mode (e.g., unrelated to a particular detection of logic states), and may store the determined parameter for performing the access operation at a later time. In some examples, the determined parameter may be based on a moving average, such as an average of multiple determinations of Z (e.g., multiple determinations of $Z_{i,j}$, such as a most-recent 128 determinations of $Z_{i,j}$, whether using the same indices for i and j, or different indices). In various examples, indices i and j may be preconfigured at the memory device 100, or dynamically determined by the memory device 100 (e.g., based on a quantity n in a particular population, based on a quantity n in a particular page arrangement, based on a quantity n relevant to a particular mode of operation, based on determining a quantity n for a particular access operation, encoding operation, or padding operation, or various other configurations).

Accordingly, various examples of the described techniques may be used to compensate for various changes or migrations of material characteristics or responsive behaviors of a configurable material used to store information in the memory device 100, which may improve the performance of a memory device 100 compared to other memory devices that do not compensate for such changes.

Figure 7:
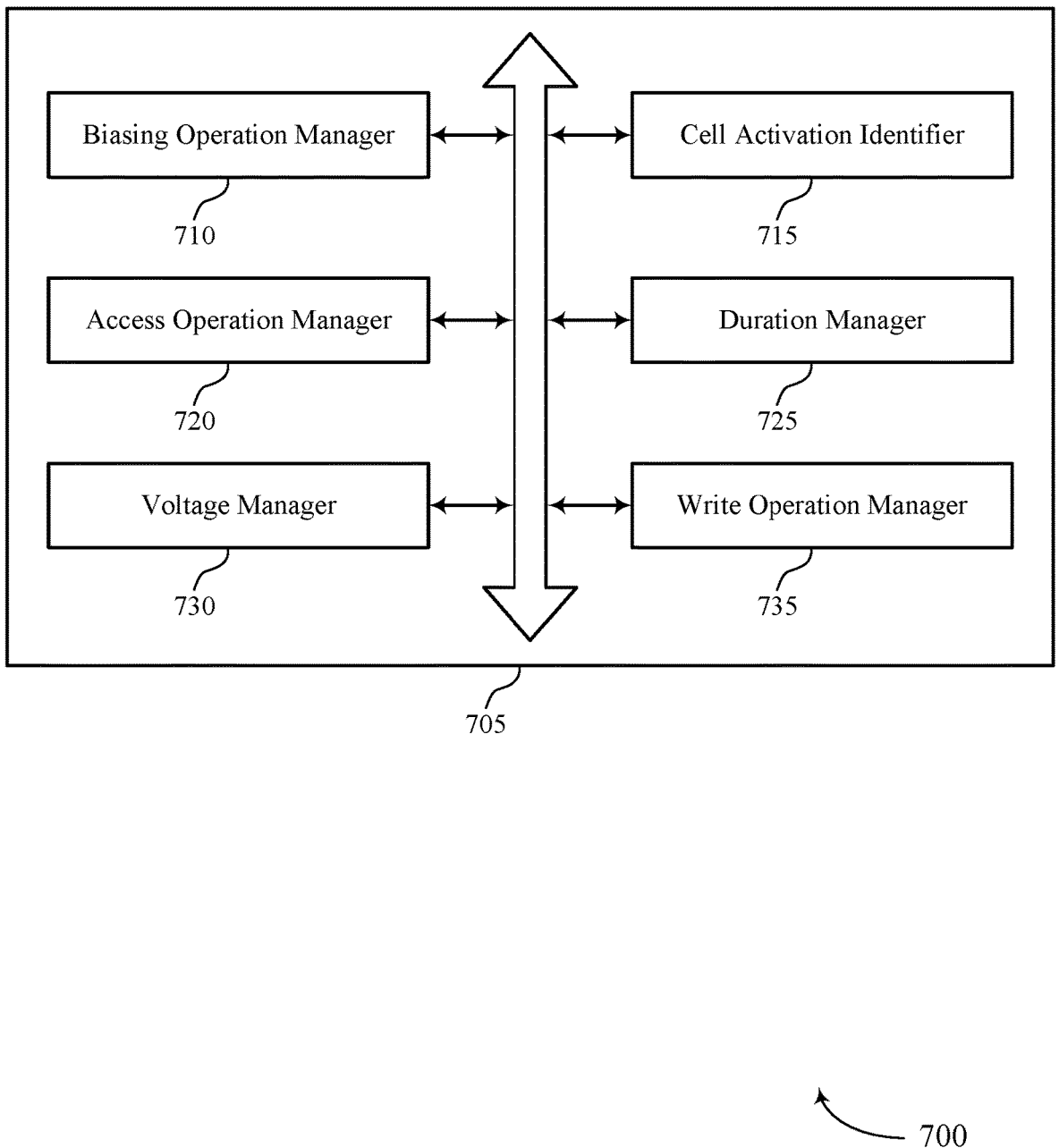
FIG. 7 shows a block diagram of a memory device that supports distribution-following access operations for a memory device in accordance with aspects of the present disclosure.

FIG. 7 shows a block diagram 700 of a memory device 705 that supports distribution-following access operations for a memory device in accordance with examples as disclosed herein. The memory device 705 may be an example of aspects of a memory device as described with reference to FIGS. 1 through 6. The memory device 705 may include a biasing operation manager 710, a cell activation identifier 715, an access operation manager 720, a duration manager 725, a voltage manager 730, and a write operation manager 735. Each of these modules may communicate, directly or indirectly, with one another (e.g., via one or more buses).

The biasing operation manager 710 may initiate a biasing operation on a set of memory cells.

In some examples, the biasing operation manager 710 may bias the set of memory cells with a voltage that increases over the biasing operation (e.g., a ramped voltage, a stepped voltage).

The cell activation identifier 715 may identify, at a first condition of the biasing operation, an activation of a first memory cell of the set of memory cells. In some examples, the cell activation identifier 715 may identify, at a second condition of the biasing operation, an activation of a second memory cell of the set of memory cells.

In some examples, the cell activation identifier 715 may identify the activation of the first memory cell based on determining that the biasing operation has activated a first quantity of memory cells of the set of memory cells.

In some examples, the cell activation identifier 715 may identify the activation of the second memory cell based on determining that the biasing operation has activated a second quantity of memory cells of the set of memory cells.

In some examples, to identify the activation of the first memory cell, identify the activation of the second memory cell, or both, the cell activation identifier 715 may identify a thresholding of the respective memory cell.

In some examples, to identify the activation of the first memory cell, identify the activation of the second memory cell, or both, the cell activation identifier 715 may identify a change of resistance of the respective memory cell.

The access operation manager 720 may determine a parameter of an access operation based on a difference between the first condition and the second condition.

In some examples, the access operation manager 720 may modify the access operation based on the determined parameter.

In some cases, the first condition corresponds to a first time of the biasing operation and the second condition corresponds to a second time of the biasing operation, and the duration manager 725 may determine a duration of the access operation based on a difference between the first time and the second time. In some examples, the duration manager 725 may determine the duration based on an average of the first time and the second time and the difference between the first time and the second time. In some examples, the duration manager 725 may determine the duration based on the second time and the difference between the first time and the second time. In some examples, the duration manager 725 may determine a completion time of the access operation based on a difference between the first time and the second time.

In some cases, the first condition corresponds to a first voltage of the biasing operation and the second condition corresponds to a second voltage of the biasing operation, and the voltage manager 730 may determine a voltage for evaluation of the access operation based on a difference between the first voltage and the second voltage. In some examples, the voltage manager 730 may determine the voltage for evaluation of the access operation based on the second voltage and the difference between the first voltage and the second voltage. In some examples, the voltage manager 730 may determine the voltage for evaluation of the access operation based on an average of the first voltage and the second voltage and the difference between the first voltage and the second voltage. In some examples, the voltage manager 730 may determine a reference voltage of the access operation based on a difference between the first voltage and the second voltage.

The write operation manager 735 may write the set of memory cells with a first quantity of memory cells having a first logic state and a second quantity of memory cells having a second logic state, where identifying the activation of the first memory cell and identifying the activation of the second memory cell are based on the first quantity.

Figure 8:
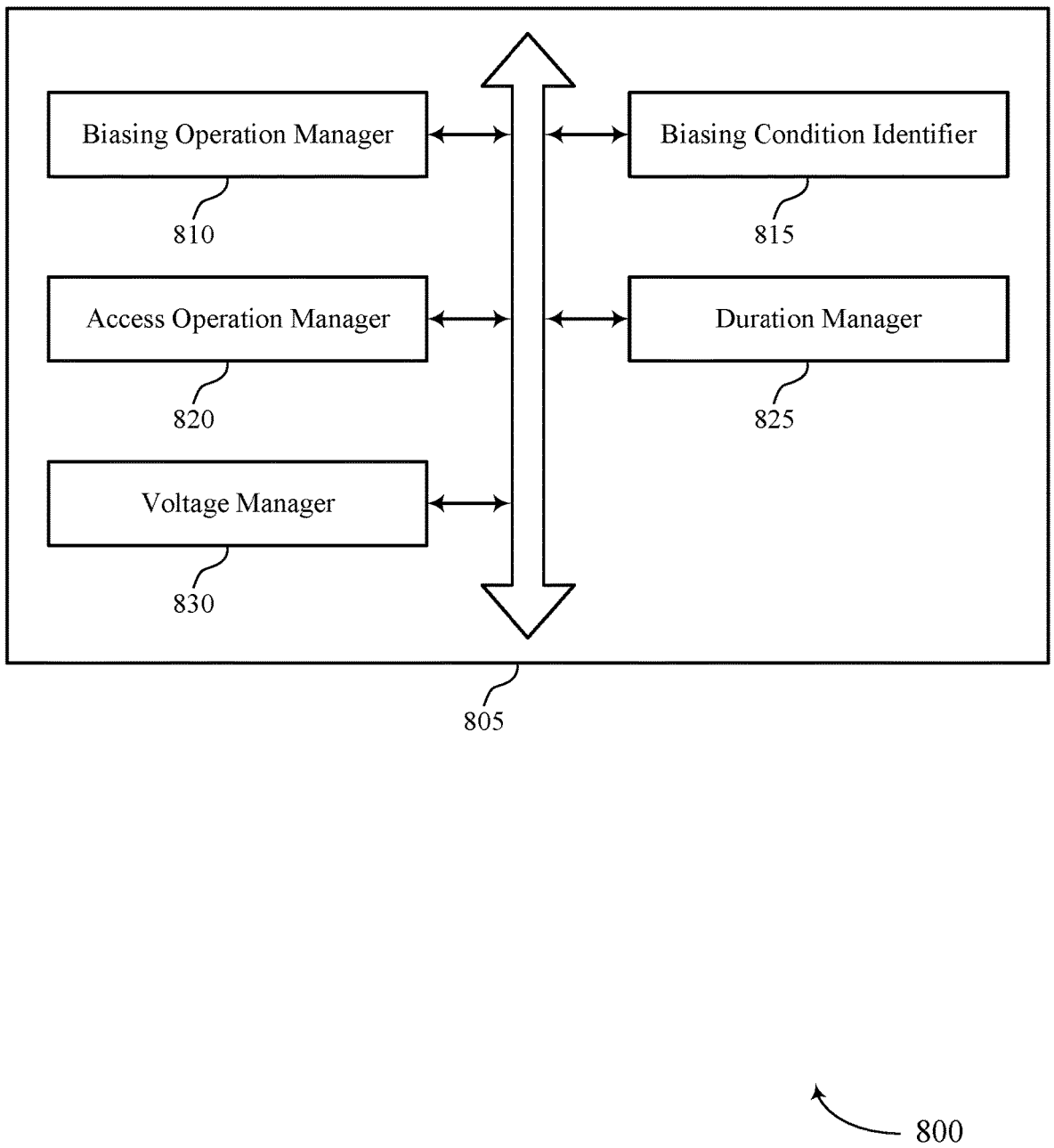
FIG. 8 shows a block diagram of a memory device that supports distribution-following access operations for a memory device in accordance with aspects of the present disclosure.

FIG. 8 shows a block diagram 800 of a memory device 805 that supports distribution-following access operations for a memory device in accordance with examples as disclosed herein. The memory device 805 may be an example of aspects of a memory device as described with reference to FIGS. 1 through 6. The memory device 805 may include a biasing operation manager 810, a biasing condition identifier 815, an access operation manager 820, a duration manager 825, and a voltage manager 830. Each of these modules may communicate, directly or indirectly, with one another (e.g., via one or more buses).

The biasing operation manager 810 may initiate a biasing operation on a set of memory cells.

The biasing condition identifier 815 may identify a first condition of the biasing operation corresponding to activation of a first quantity of memory cells of the set of memory cells. In some examples, the biasing condition identifier 815 may identify a second condition of the biasing operation corresponding to activation of a second quantity of memory cells of the set of memory cells.

The access operation manager 820 may determine a parameter of an access operation based on a difference between the first condition and the second condition.

In some examples, the access operation manager 820 may determine a condition for ending the biasing operation.

The duration manager 825 may determine an end time of the biasing operation.

The voltage manager 830 may determine an end voltage of the biasing operation.

Figure 9:
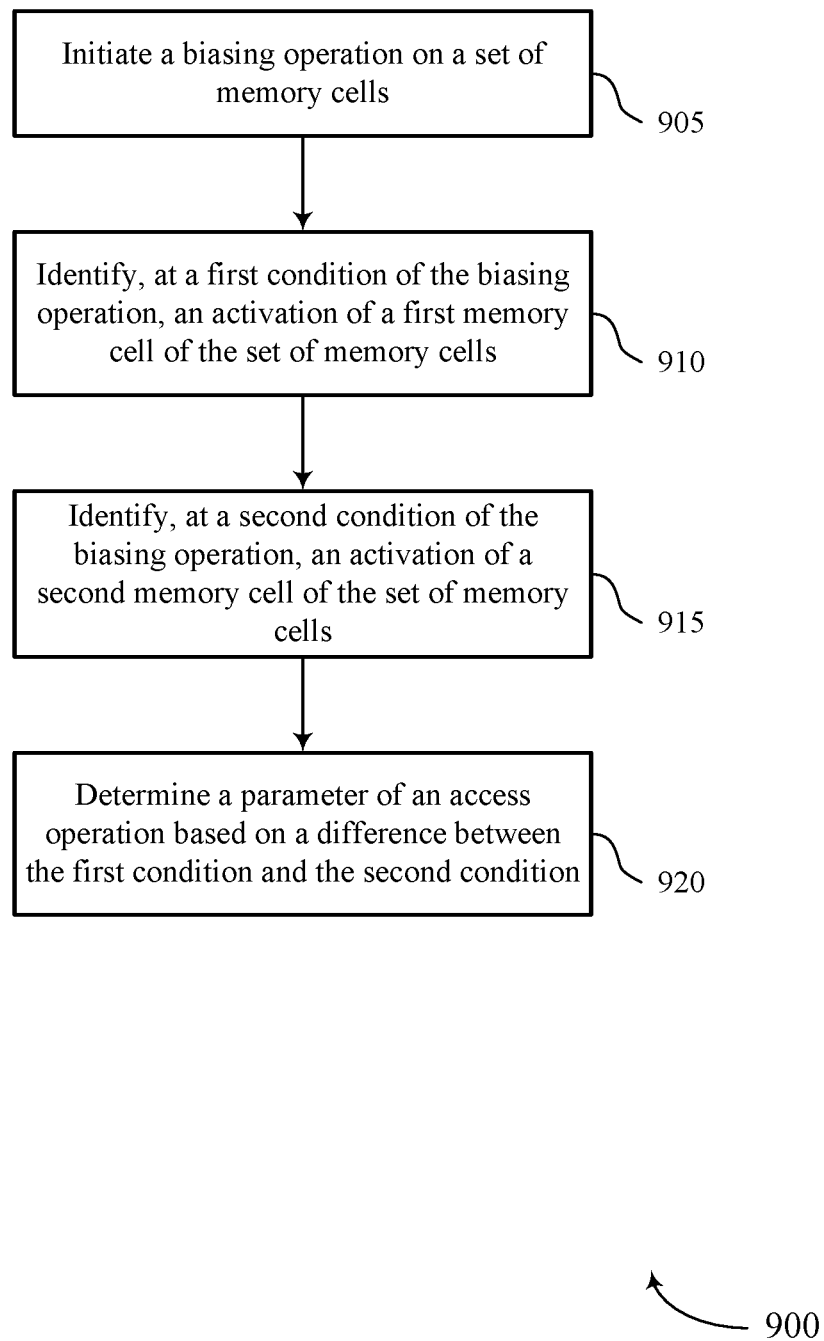
FIGS. 9 and 10 show flowcharts illustrating a method or methods that support distribution-following access operations for a memory device in accordance with examples as disclosed herein.

FIG. 9 shows a flowchart illustrating a method or methods 900 that supports distribution-following access operations for a memory device in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may initiate a biasing operation on a set of memory cells. The operations of 905 may be performed according to the methods described herein. In some examples, aspects of the operations of 905 may be performed by a biasing operation manager as described with reference to FIG. 7.

At 910, the memory device may identify, at a first condition of the biasing operation, an activation of a first memory cell of the set of memory cells. The operations of 910 may be performed according to the methods described herein. In some examples, aspects of the operations of 910 may be performed by a cell activation identifier as described with reference to FIG. 7.

At 915, the memory device may identify, at a second condition of the biasing operation, an activation of a second memory cell of the set of memory cells. The operations of 915 may be performed according to the methods described herein. In some examples, aspects of the operations of 915 may be performed by a cell activation identifier as described with reference to FIG. 7.

At 920, the memory device may determine a parameter of an access operation based on a difference between the first condition and the second condition. The operations of 920 may be performed according to the methods described herein. In some examples, aspects of the operations of 920 may be performed by an access operation manager as described with reference to FIG. 7.

In some examples, an apparatus as described herein may perform a method or methods, such as the method 900. The apparatus may include features, circuitry, means, or instructions (e.g., a non-transitory computer-readable medium storing instructions executable by a processor) for initiating a biasing operation on a set of memory cells, identifying, at a first condition of the biasing operation, an activation of a first memory cell of the set of memory cells, identifying, at a second condition of the biasing operation, an activation of a second memory cell of the set of memory cells, and determining a parameter of an access operation based on a difference between the first condition and the second condition.

Some examples of the method 900 and the apparatus described herein may further include operations, features, circuitry, means, or instructions for modifying the access operation based on the determined parameter.

In some examples of the method 900 and the apparatus described herein, the first condition corresponds to a first time of the biasing operation and the second condition corresponds to a second time of the biasing operation, and determining the parameter may include operations, features, circuitry, means, or instructions for determining a duration of the access operation based on a difference between the first time and the second time.

In some examples of the method 900 and the apparatus described herein, determining the duration of the access operation may include operations, features, circuitry, means, or instructions for determining the duration based on an average of the first time and the second time and the difference between the first time and the second time.

In some examples of the method 900 and the apparatus described herein, determining the duration of the access operation may include operations, features, circuitry, means, or instructions for determining the duration based on the second time and the difference between the first time and the second time.

In some examples of the method 900 and the apparatus described herein, the first condition corresponds to a first voltage of the biasing operation and the second condition corresponds to a second voltage of the biasing operation, and determining the parameter may include operations, features, circuitry, means, or instructions for determining a voltage for evaluation of the access operation based on a difference between the first voltage and the second voltage.

In some examples of the method 900 and the apparatus described herein, determining the voltage for evaluation of the access operation may include operations, features, circuitry, means, or instructions for determining the voltage for evaluation of the access operation based on the second voltage and the difference between the first voltage and the second voltage.

In some examples of the method 900 and the apparatus described herein, determining the voltage for evaluation of the access operation may include operations, features, circuitry, means, or instructions for determining the voltage for evaluation of the access operation based on an average of the first voltage and the second voltage and the difference between the first voltage and the second voltage.

Some examples of the method 900 and the apparatus described herein may further include operations, features, circuitry, means, or instructions for writing the set of memory cells with a first quantity of memory cells having a first logic state and a second quantity of memory cells having a second logic state, and identifying the activation of the first memory cell and identifying the activation of the second memory cell may be based on the first quantity.

In some examples of the method 900 and the apparatus described herein, the biasing operation may include operations, features, circuitry, means, or instructions for biasing the set of memory cells with a voltage that increases over the biasing operation (e.g., a ramped voltage, a stepped voltage).

Some examples of the method 900 and the apparatus described herein may further include operations, features, circuitry, means, or instructions for identifying the activation of the first memory cell based on determining that the biasing operation has activated a first quantity of memory cells of the set of memory cells, and identifying the activation of the second memory cell based on determining that the biasing operation has activated a second quantity of memory cells of the set of memory cells.

In some examples of the method 900 and the apparatus described herein, the access operation includes the biasing operation, the first condition includes a first voltage of the biasing operation, and the second condition includes a second voltage of the biasing operation, and determining the parameter of the access operation may include operations, features, circuitry, means, or instructions for determining a reference voltage of the access operation based on a difference between the first voltage and the second voltage.

In some examples of the method 900 and the apparatus described herein, the access operation includes the biasing operation, the first condition includes a first time of the biasing operation, and the second condition includes a second time of the biasing operation, and determining the parameter of the access operation may include operations, features, circuitry, means, or instructions for determining a completion time of the access operation based on a difference between the first time and the second time.

In some examples of the method 900 and the apparatus described herein, identifying the activation of the first memory cell, identifying the activation of the second memory cell, or both may include operations, features, circuitry, means, or instructions for identifying a thresholding of the respective memory cell.

In some examples of the method 900 and the apparatus described herein, identifying the activation of the first memory cell, identifying the activation of the second memory cell, or both may include operations, features, circuitry, means, or instructions for identifying a change of resistance of the respective memory cell.

Figure 10:
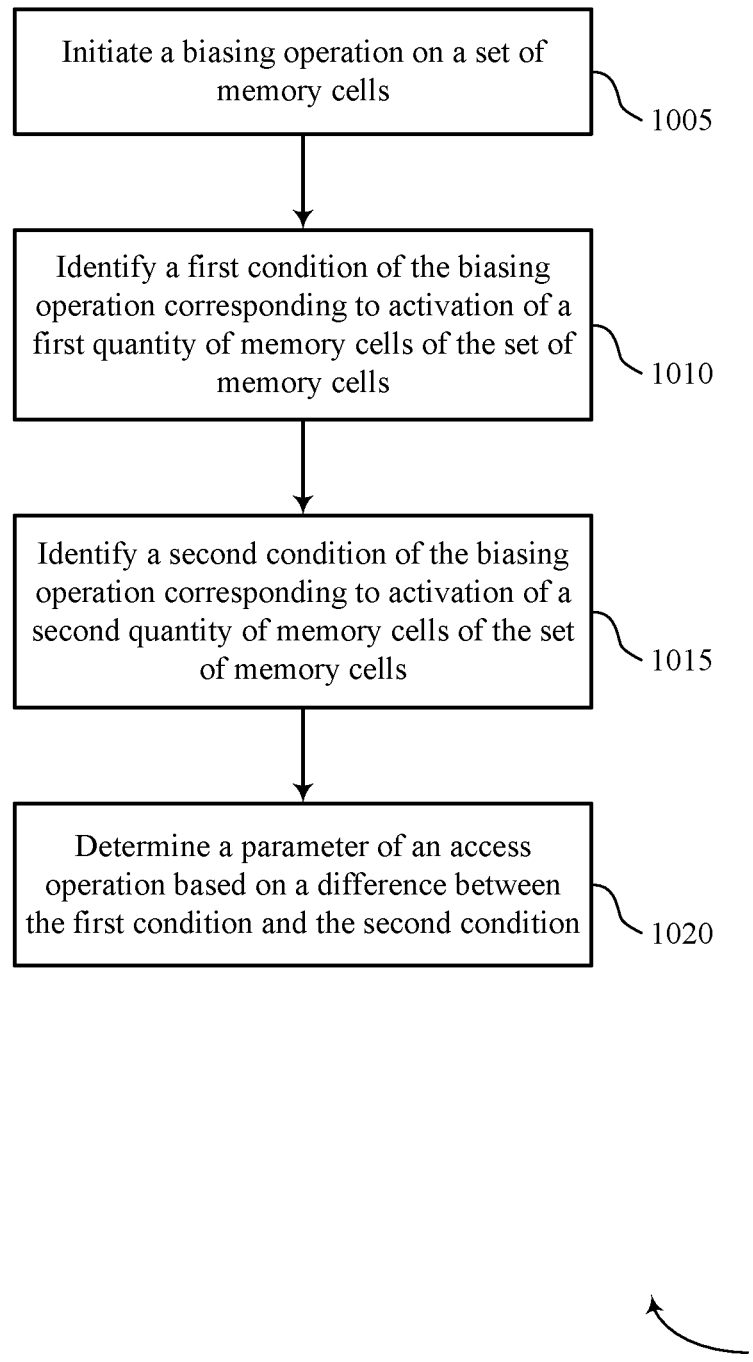

FIG. 10 shows a flowchart illustrating a method or methods 1000 that supports distribution-following access operations for a memory device in accordance with aspects of the present disclosure. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may initiate a biasing operation on a set of memory cells. The operations of 1005 may be performed according to the methods described herein. In some examples, aspects of the operations of 1005 may be performed by a biasing operation manager as described with reference to FIG. 8.

At 1010, the memory device may identify a first condition of the biasing operation corresponding to activation of a first quantity of memory cells of the set of memory cells. The operations of 1010 may be performed according to the methods described herein. In some examples, aspects of the operations of 1010 may be performed by a biasing condition identifier as described with reference to FIG. 8.

At 1015, the memory device may identify a second condition of the biasing operation corresponding to activation of a second quantity of memory cells of the set of memory cells. The operations of 1015 may be performed according to the methods described herein. In some examples, aspects of the operations of 1015 may be performed by a biasing condition identifier as described with reference to FIG. 8.

At 1020, the memory device may determine a parameter of an access operation based on a difference between the first condition and the second condition. The operations of 1020 may be performed according to the methods described herein. In some examples, aspects of the operations of 1020 may be performed by an access operation manager as described with reference to FIG. 8.

In some examples, an apparatus as described herein may perform a method or methods, such as the method 1000. The apparatus may include features, circuitry, means, or instructions (e.g., a non-transitory computer-readable medium storing instructions executable by a processor) for initiating a biasing operation on a set of memory cells, identifying a first condition of the biasing operation corresponding to activation of a first quantity of memory cells of the set of memory cells, identifying a second condition of the biasing operation corresponding to activation of a second quantity of memory cells of the set of memory cells, and determining a parameter of an access operation based on a difference between the first condition and the second condition.

In some examples of the method 1000 and the apparatus described herein, the access operation includes the biasing operation, and determining the parameter of the access operation may include operations, features, circuitry, means, or instructions for determining a condition for ending the biasing operation.

In some examples of the method 1000 and the apparatus described herein, determining the condition for ending the biasing operation may include operations, features, circuitry, means, or instructions for determining an end time of the biasing operation.

In some examples of the method 1000 and the apparatus described herein, determining the condition for ending the biasing operation may include operations, features, circuitry, means, or instructions for determining an end voltage of the biasing operation.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of memory cells and circuitry coupled with the set of memory cells. The circuitry may be configured to initiate a biasing operation on the set of memory cells, identify, at a first condition of the biasing operation, an activation of a first quantity of the set of memory cells, identify, at a second condition of the biasing operation, an activation of a second quantity of the set of memory cells, and determine a parameter of an access operation based on a difference between the first condition and the second condition.

In some examples, the first condition corresponds to a first time of the biasing operation and the second condition corresponds to a second time of the biasing operation, and, to determine the parameter of the access operation, the circuitry may be configured to determine a duration of the biasing operation based on a difference between the first time and the second time. In some examples, the circuitry may be configured to determine the duration based on an average of the first time and the second time and the difference between the first time and the second time. In some examples, the circuitry may be configured to determine the duration based on the second time and the difference between the first time and the second time.

In some examples, the first condition corresponds to a first voltage of the biasing operation and the second condition corresponds to a second voltage of the biasing operation, and, to determine the parameter of the access operation, the circuitry may be configured to determine a voltage of the access operation based on a difference between the first voltage and the second voltage. In some examples, the circuitry may be configured to determine a reference voltage of the access operation based on the second voltage and the difference between the first voltage and the second voltage. In some examples, the circuitry may be configured to determine a reference voltage of the access operation based on an average of the first voltage and the second voltage and the difference between the first voltage and the second voltage.

In some examples, the circuitry may be configured to write the set of memory cells with a third quantity of memory cells having a first logic state and a fourth quantity of memory cells having a second logic state, and the circuitry may be configured to identify the activation of the first quantity of memory cells and identify the activation of the second quantity of memory cells based on the third quantity.

In some examples, to perform the biasing operation, the circuitry may be configured to bias the set of memory cells with a voltage that increases over the biasing operation.

In some examples, the access operation includes the biasing operation, the first condition includes a first voltage of the biasing operation, and the second condition includes a second voltage of the biasing operation, and, to determine the parameter of the access operation, the circuitry may be configured to determine a reference voltage of the access operation based on a difference between the first voltage and the second voltage.

In some examples, the access operation includes the biasing operation, the first condition includes a first time of the biasing operation, and the second condition includes a second time of the biasing operation, and, to determine the parameter of the access operation, the circuitry may be configured to determine a completion time of the access operation based on a difference between the first time and the second time.

In some examples, the circuitry may be configured to modify the access operation based on the determined parameter.

In some examples, to identify the activation of the first memory cell, to identify the activation of the second memory cell, or both, the circuitry may be configured to identify a thresholding of the respective memory cell.

In some examples, to identify the activation of the first memory cell, to identify the activation of the second memory cell, or both, the circuitry may be configured to identify a change of resistance of the respective memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   initiating a biasing operation on a set of memory cells;
   identifying, at a first condition of the biasing operation, an activation of a first memory cell of the set of memory cells;
   identifying, at a second condition of the biasing operation, an activation of a second memory cell of the set of memory cells; and
   determining a parameter of an access operation based at least in part on a difference between the first condition and the second condition.

2. The method of claim 1, further comprising:
modifying the access operation based at least in part on the determined parameter.

3. The method of claim 1, wherein the first condition corresponds to a first time of the biasing operation and the second condition corresponds to a second time of the biasing operation, and determining the parameter comprises:
determining a duration of the biasing operation based at least in part on a difference between the first time and the second time.

4. The method of claim 3, wherein determining the duration of the access operation comprises:
determining the duration based at least in part on an average of the first time and the second time and the difference between the first time and the second time.

5. The method of claim 3, wherein determining the duration of the access operation comprises:
determining the duration based at least in part on the second time and the difference between the first time and the second time.

6. The method of claim 1, wherein the first condition corresponds to a first voltage of the biasing operation and the second condition corresponds to a second voltage of the biasing operation, and wherein determining the parameter comprises:
determining a voltage for evaluation of the access operation based at least in part on a difference between the first voltage and the second voltage.

7. The method of claim 6, wherein determining the voltage for evaluation of the access operation comprises:
determining the voltage for evaluation of the access operation based at least in part on the second voltage and the difference between the first voltage and the second voltage.

8. The method of claim 6, wherein determining the voltage for evaluation of the access operation comprises:
determining the voltage for evaluation of the access operation based at least in part on an average of the first voltage and the second voltage and the difference between the first voltage and the second voltage.

9. The method of claim 1, further comprising:
writing the set of memory cells with a first quantity of memory cells having a first logic state and a second quantity of memory cells having a second logic state, wherein identifying the activation of the first memory cell and identifying the activation of the second memory cell are based at least in part on the first quantity.

10. The method of claim 1, wherein the biasing operation comprises:
biasing the set of memory cells with a voltage that increases over the biasing operation.

11. The method of claim 1, wherein:
identifying the activation of the first memory cell is based at least in part on determining that the biasing operation has activated a first quantity of memory cells of the set of memory cells; and
identifying the activation of the second memory cell is based at least in part on determining that the biasing operation has activated a second quantity of memory cells of the set of memory cells.

12. The method of claim 1, wherein the access operation comprises the biasing operation, the first condition comprises a first voltage of the biasing operation, and the second condition comprises a second voltage of the biasing operation, and determining the parameter of the access operation comprises:
determining a reference voltage of the access operation based at least in part on a difference between the first voltage and the second voltage.

13. The method of claim 1, wherein the access operation comprises the biasing operation, the first condition comprises a first time of the biasing operation, and the second condition comprises a second time of the biasing operation, and determining the parameter of the access operation comprises:
determining a completion time of the access operation based at least in part on a difference between the first time and the second time.

14. The method of claim 1, wherein identifying the activation of the first memory cell, identifying the activation of the second memory cell, or both comprises:
identifying a thresholding of the respective memory cell.

15. The method of claim 1, wherein identifying the activation of the first memory cell, identifying the activation of the second memory cell, or both comprises:
identifying a change of resistance of the respective memory cell.

16. An apparatus, comprising:
a set of memory cells; and
circuitry coupled with the set of memory cells and configured to:
initiate a biasing operation on the set of memory cells;
identify, at a first condition of the biasing operation, an activation of a first memory cell of the set of memory cells;
identify, at a second condition of the biasing operation, an activation of a second memory cell of the set of memory cells; and
determine a parameter of an access operation based at least in part on a difference between the first condition and the second condition.

17. The apparatus of claim 16, wherein the first condition corresponds to a first time of the biasing operation and the second condition corresponds to a second time of the biasing operation, and to determine the parameter of the access operation, the circuitry is configured to:
determine a duration of the biasing operation based at least in part on a difference between the first time and the second time.

18. The apparatus of claim 16, wherein the first condition corresponds to a first voltage of the biasing operation and the second condition corresponds to a second voltage of the biasing operation, and to determine the parameter of the access operation, the circuitry is configured to:
determine a voltage for evaluation of the access operation based at least in part on a difference between the first voltage and the second voltage.

19. The apparatus of claim 16, wherein the circuitry is configured to:
write the set of memory cells with a first quantity of memory cells having a first logic state and a fourth quantity of memory cells having a second logic state, wherein the circuitry is configured to identify the activation of the first memory cell and identify the activation of the second memory cell based at least in part on the first quantity.

20. A non-transitory computer-readable medium storing code, the code comprising instructions executable by an electronic device to:
initiate a biasing operation on a set of memory cells;
identify, at a first condition of the biasing operation, an activation of a first memory cell of the set of memory cells;

identify, at a second condition of the biasing operation, an activation of a second memory cell of the set of memory cells; and determine a parameter of an access operation based at least in part on a difference between the first condition and the second condition.

* * * * *